(12) United States Patent
Zhang et al.

(10) Patent No.: US 12,261,162 B2
(45) Date of Patent: *Mar. 25, 2025

(54) LIGHT-EMITTING DIODE DISPLAY PANEL WITH MICRO LENS ARRAY

(71) Applicant: Jade Bird Display (Shanghai) Limited, Shanghai (CN)

(72) Inventors: Lei Zhang, Albuquerque, NM (US); Fang Ou, Monterey Park, CA (US); Qiming Li, Albuquerque, NM (US)

(73) Assignee: Jade Bird Display (Shanghai) Limited, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/349,996

(22) Filed: Jul. 11, 2023

(65) Prior Publication Data

US 2023/0361099 A1    Nov. 9, 2023

Related U.S. Application Data

(60) Continuation of application No. 17/809,405, filed on Jun. 28, 2022, now Pat. No. 11,742,339, which is a
(Continued)

(51) Int. Cl.
*H01L 25/16* (2023.01)
*H01L 23/00* (2006.01)
(Continued)

(52) U.S. Cl.
CPC ........ *H01L 25/167* (2013.01); *H01L 25/0753* (2013.01); *H01L 25/50* (2013.01);
(Continued)

(58) Field of Classification Search
None
See application file for complete search history.

(56) References Cited

U.S. PATENT DOCUMENTS 3,950,738 A     4/1976 Hayashi et al.
5,073,041 A  * 12/1991 Rastani ................. H01S 5/423
                                                          372/101
(Continued)

FOREIGN PATENT DOCUMENTS

CN         1619846 A      5/2005
CN       101241882 A      8/2008
(Continued)

OTHER PUBLICATIONS

Choi H.W. et al., "Nitride micro-display with integrated microlenses", Physica Status Solidi, vol. 2, No. 7, pp. 2903-2906, Mar. 11, 2005.
(Continued)

*Primary Examiner* — Joshua King
(74) *Attorney, Agent, or Firm* — FINNEGAN, HENDERSON, FARABOW, GARRETT & DUNNER LLP

(57) ABSTRACT

A light-emitting diode (LED) display panel includes a substrate, a driver circuit array on the substrate and including a plurality of pixel driver circuits arranged in an array, an LED array including a plurality of LED dies each being coupled to one of the pixel driver circuits, a micro lens array including a plurality of micro lenses each corresponding to
(Continued)

and being arranged over at least one of the LED dies, and an optical spacer formed between the LED array and the micro lens array.

20 Claims, 30 Drawing Sheets

Related U.S. Application Data continuation of application No. 17/133,842, filed on Dec. 24, 2020, now Pat. No. 11,417,641, which is a division of application No. 16/387,896, filed on Apr. 18, 2019, now Pat. No. 10,910,356, which is a division of application No. 15/239,467, filed on Aug. 17, 2016, now Pat. No. 10,304,811, which is a continuation-in-part of application No. 15/007,959, filed on Jan. 27, 2016, now Pat. No. 10,177,127.

(60) Provisional application No. 62/259,810, filed on Nov. 25, 2015, provisional application No. 62/258,072, filed on Nov. 20, 2015, provisional application No. 62/214,395, filed on Sep. 4, 2015.

(51) Int. Cl.
*H01L 25/00* (2006.01)
*H01L 25/075* (2006.01)
*H01L 33/52* (2010.01)
*H01L 33/58* (2010.01)
*H01L 33/62* (2010.01)

(52) U.S. Cl.
CPC .............. *H01L 33/52* (2013.01); *H01L 24/97* (2013.01); *H01L 33/58* (2013.01); *H01L 33/62* (2013.01); *H01L 2224/18* (2013.01); *H01L 2224/73267* (2013.01); *H01L 2224/92244* (2013.01); *H01L 2933/0058* (2013.01); *H01L 2933/0066* (2013.01)

(56) References Cited

U.S. PATENT DOCUMENTS

| | | | |
|---|---|---|---|
| 5,264,699 A | 11/1993 | Barton et al. | |
| 5,621,225 A | 4/1997 | Shieh et al. | |
| 5,624,174 A | 4/1997 | Loucks | |
| 5,653,522 A | 8/1997 | Loucks | |
| 5,723,264 A | 3/1998 | Robello | |
| 6,005,262 A | 12/1999 | Cunningham et al. | |
| 6,262,540 B1 | 7/2001 | Seko | |
| 6,485,993 B2 | 11/2002 | Trezza et al. | |
| 7,829,902 B2 | 11/2010 | El-Ghoroury et al. | |
| 8,354,679 B1 | 1/2013 | D'Evelyn et al. | |
| 8,535,961 B1 | 9/2013 | Kuo et al. | |
| 8,557,616 B2 | 10/2013 | Lau et al. | |
| 8,567,960 B2 | 10/2013 | El-Ghoroury et al. | |
| 8,642,363 B2 | 2/2014 | Lau et al. | |
| 8,851,682 B2 | 10/2014 | Tanigawa et al. | |
| 8,931,906 B2 | 1/2015 | Huang et al. | |
| 9,041,025 B2 | 5/2015 | Lau et al. | |
| 10,078,158 B2 | 9/2018 | Zhang | |
| 10,325,892 B2 | 6/2019 | Wu et al. | |
| 2001/0004251 A1 | 6/2001 | Kurematsu | |
| 2002/0135553 A1 | 9/2002 | Nagai et al. | |
| 2002/0153529 A1 | 10/2002 | Shie | |
| 2002/0196431 A1 | 12/2002 | DeFelice et al. | |
| 2003/0210213 A1 | 11/2003 | Wu | |
| 2004/0021833 A1 | 2/2004 | Koide | |
| 2004/0027675 A1 | 2/2004 | Wu | |
| 2004/0062040 A1 | 4/2004 | Blume et al. | |
| 2004/0208596 A1 | 10/2004 | Bringans et al. | |
| 2005/0061950 A1* | 3/2005 | Jiang .................. | H01L 27/14627 250/214.1 |
| 2005/0067944 A1 | 3/2005 | Masuda | |
| 2006/0023167 A1 | 2/2006 | Chiang et al. | |
| 2006/0274189 A1 | 12/2006 | Mouli | |
| 2007/0069220 A1 | 3/2007 | Ogihara | |
| 2007/0099395 A1 | 5/2007 | Sridhar et al. | |
| 2007/0211492 A1 | 9/2007 | Lin | |
| 2008/0308820 A1 | 12/2008 | Louwsma et al. | |
| 2009/0075843 A1 | 3/2009 | Jiang et al. | |
| 2009/0085045 A1 | 4/2009 | Marion et al. | |
| 2009/0217516 A1 | 9/2009 | Pawlowski et al. | |
| 2010/0020502 A1 | 1/2010 | Tain et al. | |
| 2010/0148198 A1* | 6/2010 | Sugizaki ................. | H01L 33/62 257/E33.056 |
| 2010/0283069 A1 | 11/2010 | Rogers | |
| 2010/0295070 A1 | 11/2010 | Su | |
| 2010/0327386 A1 | 12/2010 | Nagai et al. | |
| 2011/0096045 A1 | 4/2011 | Ito | |
| 2011/0096134 A1 | 4/2011 | Kang et al. | |
| 2011/0169157 A1 | 7/2011 | Fan | |
| 2011/0233586 A1 | 9/2011 | Kojima | |
| 2011/0299044 A1* | 12/2011 | Yeh ......................... | H04N 9/315 353/52 |
| 2011/0300644 A1 | 12/2011 | Akimoto | |
| 2012/0043563 A1 | 2/2012 | Ibbetson | |
| 2012/0050694 A1* | 3/2012 | Huang .................. | H01L 27/156 353/38 |
| 2012/0220059 A1 | 8/2012 | Ito | |
| 2012/0223875 A1 | 9/2012 | Lau et al. | |
| 2012/0288995 A1 | 11/2012 | El-Ghoroury et al. | |
| 2013/0002730 A1* | 1/2013 | Tanigawa ............ | H01L 25/0753 445/24 |
| 2013/0075587 A1* | 3/2013 | Suzuki .............. | H01L 27/14627 257/E31.127 |
| 2013/0126081 A1 | 5/2013 | Hu | |
| 2013/0126098 A1 | 5/2013 | Bibl et al. | |
| 2013/0126827 A1 | 5/2013 | Bibl et al. | |
| 2013/0126914 A1 | 5/2013 | Pan | |
| 2013/0126921 A1 | 5/2013 | Mohammed | |
| 2013/0128585 A1 | 5/2013 | Bibl et al. | |
| 2013/0130440 A1 | 5/2013 | Hu et al. | |
| 2013/0134459 A1 | 5/2013 | West et al. | |
| 2013/0187174 A1 | 7/2013 | Tischler | |
| 2013/0193592 A1 | 8/2013 | Peil et al. | |
| 2013/0207964 A1 | 8/2013 | Fleck et al. | |
| 2013/0210194 A1 | 8/2013 | Bibl et al. | |
| 2013/0217161 A1 | 8/2013 | Hsu | |
| 2013/0240962 A1 | 9/2013 | Wang | |
| 2013/0264589 A1 | 10/2013 | Bergmann et al. | |
| 2013/0299924 A1 | 11/2013 | Weber et al. | |
| 2014/0008667 A1 | 1/2014 | Lau et al. | |
| 2014/0008813 A1 | 1/2014 | Golda et al. | |
| 2014/0048909 A1 | 2/2014 | Golda et al. | |
| 2014/0061687 A1 | 3/2014 | Hu et al. | |
| 2014/0084482 A1 | 3/2014 | Hu et al. | |
| 2014/0091420 A1 | 4/2014 | Payne | |
| 2014/0098556 A1 | 4/2014 | Von Malm et al. | |
| 2014/0111408 A1 | 4/2014 | Lau et al. | |
| 2014/0158415 A1 | 6/2014 | Golda et al. | |
| 2014/0159043 A1 | 6/2014 | Sakariya et al. | |
| 2014/0159064 A1 | 6/2014 | Sakariya et al. | |
| 2014/0159065 A1 | 6/2014 | Hu et al. | |
| 2014/0159066 A1 | 6/2014 | Hu et al. | |
| 2014/0159067 A1 | 6/2014 | Sakariya et al. | |
| 2014/0159324 A1 | 6/2014 | Golda et al. | |
| 2014/0168037 A1 | 6/2014 | Sakariya et al. | |
| 2014/0168988 A1 | 6/2014 | Petersen | |
| 2014/0169924 A1 | 6/2014 | Golda et al. | |
| 2014/0169927 A1 | 6/2014 | Golda et al. | |
| 2014/0196851 A1 | 7/2014 | Golda et al. | |
| 2014/0209248 A1 | 7/2014 | Golda et al. | |
| 2014/0218912 A1 | 8/2014 | Guehne et al. | |
| 2014/0241843 A1 | 8/2014 | Golda et al. | |
| 2014/0241844 A1 | 8/2014 | Golda et al. | |
| 2014/0267683 A1 | 9/2014 | Bibl et al. | |
| 2014/0319560 A1 | 10/2014 | Tischler | |
| 2014/0340900 A1 | 11/2014 | Bathurst et al. | |
| 2014/0367633 A1 | 12/2014 | Bibl et al. | |
| 2014/0367705 A1 | 12/2014 | Bibl et al. | |
| 2014/0367711 A1 | 12/2014 | Bibl et al. | |

(56) References Cited

U.S. PATENT DOCUMENTS

| | | |
|---|---|---|
| 2015/0003056 A1 | 1/2015 | Choi et al. |
| 2015/0008389 A1 | 1/2015 | Hu et al. |
| 2015/0021466 A1 | 1/2015 | Bibl et al. |
| 2015/0028362 A1 | 1/2015 | Chan et al. |
| 2015/0071320 A1 | 3/2015 | Gronenborn |
| 2015/0076528 A1 | 3/2015 | Chan et al. |
| 2015/0079709 A1 | 3/2015 | Tischler |
| 2015/0093842 A1 | 4/2015 | Higginson et al. |
| 2015/0137153 A1 | 5/2015 | Bibl et al. |
| 2015/0169011 A1 | 6/2015 | Bibl et al. |
| 2015/0179703 A1 | 6/2015 | Sakariya et al. |
| 2015/0179876 A1* | 6/2015 | Hu .................... H01L 33/20 257/13 |
| 2015/0179877 A1 | 6/2015 | Hu et al. |
| 2015/0187740 A1 | 7/2015 | McGroddy et al. |
| 2015/0187991 A1 | 7/2015 | McGroddy et al. |
| 2015/0214420 A1 | 7/2015 | Hu et al. |
| 2015/0216042 A1 | 7/2015 | Golda et al. |
| 2015/0228525 A1 | 8/2015 | Golda et al. |
| 2015/0235121 A1 | 8/2015 | Pavate et al. |
| 2015/0340351 A1 | 11/2015 | Rossi et al. |
| 2016/0276329 A1 | 9/2016 | Bono |
| 2017/0309798 A1* | 10/2017 | Bonar ................ H01L 33/0093 |

FOREIGN PATENT DOCUMENTS

| | | | |
|---|---|---|---|
| CN | 101268552 A * | 9/2008 | ......... H01L 27/1462 |
| CN | 101634800 A | 1/2010 | |
| CN | 201464787 U | 5/2010 | |
| CN | 102347325 A | 2/2012 | |
| CN | 104617121 A | 5/2015 | |
| CN | 101064330 A | 10/2017 | |
| JP | 2012019201 A | 1/2012 | |
| WO | WO 2011/006835 A1 | 1/2011 | |
| WO | WO 2015/037218 A1 | 3/2015 | |

OTHER PUBLICATIONS

European Search Report issued on Dec. 12, 2018, in counterpart European Patent Application No. 16840893.8-1211.
European Search Report issued on Dec. 14, 2018, in European Patent Application No. 16840897.9-1211.
European Search Report issued on Jan. 18, 2019, in European Patent Application No. 16840894.6-1211.
International Search Report and Written Opinion issued by the State Intellectual Property Office (SIPO) of the People's Republic of China for International Application No. PCT/IB2016/001260 dated Dec. 28, 2016.
International Search Report and Written Opinion issued by the State Intellectual Property Office (SIPO) of the People's Republic of China for International Application No. PCT/IB2016/001259 dated Jan. 22, 2017.
International Search Report and Written Opinion issued by the State Intellectual Property Office (SIPO) of the People's Republic of China for International Application No. PCT/IB2016/001342 dated Feb. 17, 2017.
Kim D et al., "Effect of GaN Microlens Array on Efficiency of GaN-Based Blue-Light-Emitting Diodes", Japanese Journal of Applied Physics, The Japan Society of Applied Physics, 2005., vol. 44, No. 1, pp. L18-L20, Oct. 10, 2004.
Office Action for U.S. Appl. No. 15/246,447 issued on Aug. 25, 2017.
Roy et al., "Microlens Array Fabrication by Enhanced Thermal Reflow Process: Towards Efficient Collection of Fluorescence Light from Microarrays," 2009, Microelectronic Engineering 86, 2255-2261 (Year: 2009).

* cited by examiner

LIGHT-EMITTING DIODE DISPLAY PANEL WITH MICRO LENS ARRAY

CROSS-REFERENCE TO RELATED APPLICATIONS

This application is a continuation of application Ser. No. 17/809,405, filed Jun. 28, 2022 (allowed), which is a continuation of application Ser. No. 17/133,842, filed Dec. 24, 2020, now U.S. Pat. No. 11,417,641, issued on Aug. 16, 2022, which is a divisional of application Ser. No. 16/387,896, filed Apr. 18, 2019, now U.S. Pat. No. 10,910,356, issued on Feb. 2, 2021, which is a divisional of application Ser. No. 15/239,467, filed Aug. 17, 2016, now U.S. Pat. No. 10,304,811, issued on May 28, 2019, which is a continuation-in-part of application Ser. No. 15/007,959, filed on Jan. 27, 2016, now U.S. Pat. No. 10,177,127, issued on Jan. 8, 2019, which is based upon and claims the benefit of priority from Provisional Application Nos. 62/214,395, 62/258,072, and 62/259,810, filed on Sep. 4, 2015, Nov. 20, 2015, and Nov. 25, 2015, respectively, the entire contents of all of which are incorporated herein by reference.

TECHNOLOGY FIELD

The disclosure relates to a semiconductor apparatus and, more particularly, to a light-emitting diode (LED) display panel including a substrate, a driver circuit including a plurality of pixel driver circuits arranged in an array, an LED array including a plurality of LED dies and an array of micro lenses, and methods of making the LED display panel.

BACKGROUND

Digital display technology has become one of the largest branches in the field of modern electronics and optoelectronics and generates demands in various applications where an image forming function is needed. Among those applications, projection-based display, which has the potential of generating a large size image with low cost, is of great interest.

In a conventional projection system based on a passive imager device, such as liquid crystal display (LCD), digital mirror devices (DMD), and liquid crystal on silicon (LCOS), the passive imager device itself does not emit light. Specifically, the conventional projection system projects images by optically modulating collimated light emitted from a light source, i.e., by either transmitting, e.g., by an LCD panel, or reflecting, e.g., by a DMD panel, part of the light at the pixel level. However, the part of the light that is not transmitted or reflected is lost, which reduces the efficiency of the projection system. Furthermore, to provide the collimated light, complex illumination optics is required to collect divergent light emitted from the light source. The illumination optics not only causes the system to be bulky but also introduces additional optical loss into the system, which further impacts the performance of the system. In a conventional projection system, typically less than 10% of the illumination light generated by the light source is used to form the projection image.

Light-emitting diodes (LEDs) made of semiconductor materials can be used in mono-color or full-color displays. In current displays that employs LEDs, the LEDs are usually used as the light source to provide the light to be optically modulated by, e.g., the LCD or the DMD panel. That is, the light emitted by the LEDs does not form images by itself. LED displays using LED panels including a plurality of LED dies as the imager devices have also been studied. In such an LED display, the LED panel is a self-emissive imager device, where each pixel can include one LED die (mono-color display) or a plurality of LED dies each of which represents one of primary colors (full-color display). However, the light emitted by the LED dies is generated from spontaneous emission and is thus not directional, resulting in a large divergence angle. The large divergence angle can cause various problems in an LED display. For example, due to the large divergence angle, the light emitted by the LED dies can be more easily scattered and/or reflected in the LED display. The scattered/reflected light can illuminate other pixels, resulting in light crosstalk between pixels, loss of sharpness, and loss of contrast.

SUMMARY

In accordance with the disclosure, there is provided a light-emitting diode (LED) display panel including a substrate, a driver circuit array on the substrate and including a plurality of pixel driver circuits arranged in an array, an LED array including a plurality of LED dies each being coupled to one of the pixel driver circuits, a micro lens array including a plurality of micro lenses each corresponding to and being arranged over at least one of the LED dies, and an optical spacer formed between the LED array and the micro lens array.

Also in accordance with the disclosure, there is provided a method for fabricating a light-emitting diode (LED) display panel. The method includes forming a transparent processing layer over an LED array having a plurality of LED dies, and processing a portion of the transparent processing layer to transform the portion into a micro lens array having a plurality of micro lenses. Each of the micro lenses corresponds to and is arranged over at least one of the LED dies.

Also in accordance with the disclosure, there is provided a method for fabricating a light-emitting diode (LED) display panel. The method includes providing a semiconductor epitaxial wafer having a semiconductor epitaxial layer formed on a semiconductor substrate. The semiconductor epitaxial layer includes a plurality of LED dies on one side of the semiconductor epitaxial layer. The method further includes aligning and bonding the semiconductor epitaxial wafer onto a driver circuit wafer having a plurality of driver circuits. Each of the LED dies is bonded to one of the driver circuits. The method also includes removing the semiconductor substrate and processing the semiconductor epitaxial layer from another side opposite to the LED dies to form a plurality of micro lenses. Each of the micro lenses corresponds to and is arranged over at least one of the LED dies.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several

DESCRIPTION OF THE EMBODIMENTS

Hereinafter, embodiments consistent with the disclosure will be described with reference to the drawings. Wherever possible, the same reference numbers will be used throughout the drawings to refer to the same or like parts.

As discussed above, LED dies have a large divergence angle, which can cause various problems such as those discussed in the Background section. Moreover, in a projection system employing an LED array having a plurality of LED dies as a self-emissive imager device, a projection lens or a projection lens set is needed to project the image generated by the LED array, and the projection lens may have a limited numerical aperture. Thus, due to the large divergence angle of the LED dies, only a portion of the light emitted by the LED dies can be collected by the projection lens. This reduces the brightness of the LED-based projection system and/or increases the power consumption.

Embodiments consistent with the disclosure include a monolithically integrated LED display panel as a self-emissive imager device, including a substrate with an array of pixel driver circuits, an array of LED dies formed over the substrate, and an array of micro lens formed over the array of LED dies, and methods of making the LED display panel. The LED display panel and projection systems based on the LED display panel combine the light source, the image forming function, and the light beam collimation function into a single monolithic device and are capable of overcoming the drawbacks of conventional projection systems.

Figure 1:
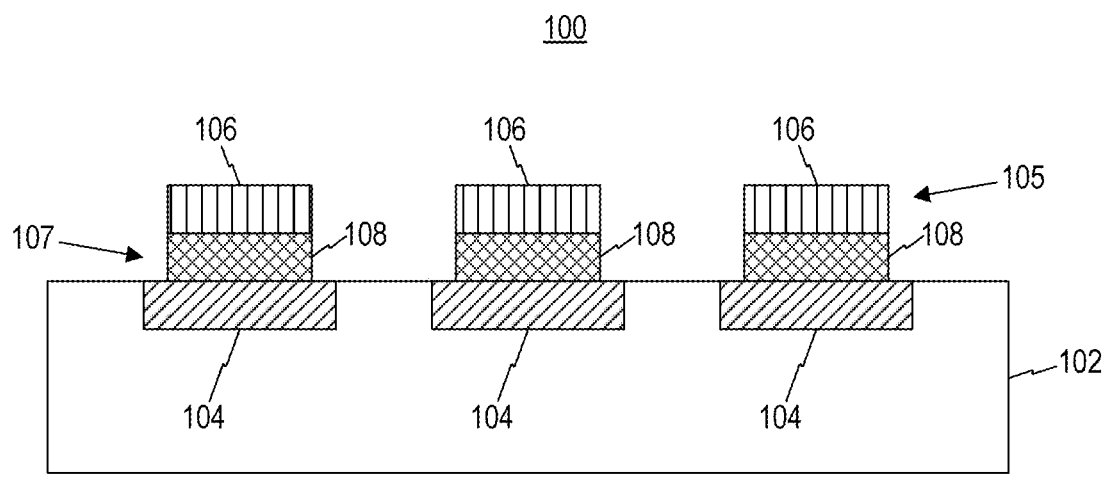
FIG. 1 is a cross-sectional view schematically showing a vertically-integrated semiconductor apparatus according to an exemplary embodiment.

FIG. 1 is a cross-sectional view schematically showing an exemplary vertically-integrated semiconductor apparatus 100 consistent with embodiments of the present disclosure. The semiconductor apparatus 100 includes a driver circuit wafer 102 having a plurality of driver circuits 104 formed therein as an array. As used herein, the term "wafer" refers to a thin portion of material that may or may not have device structures or other fine structure formed therein. The semiconductor apparatus 100 further includes a functional device epi-layer 105 formed over the driver circuit wafer 102. The functional device epi-layer 105 includes a plurality of functional device dies 106 arranged in an array. As used herein, the term "die" refers to a small block of semiconductor material or a small area of a portion of semiconductor material that includes one or more individual functional devices. The semiconductor apparatus 100 also includes a bonding metal layer 107 formed between the driver circuit wafer 102 and the functional device epi-layer 105. The bonding metal layer 107 includes a plurality of bonding metal pads 108 arranged in an array and isolated, both spatially and electrically, from each other.

Consistent with the present disclosure, each of the driver circuits 104 corresponds to and is horizontally aligned with one of the bonding metal pads 108. In addition, each of the functional device dies 106 corresponds to and is horizontally aligned with one of the driver circuits 104 and one of the bonding metal pads 108. That is, a driver circuit 104 and a corresponding functional device 106 are bonded together through only one corresponding bonding metal pad 108. In other words, the driver circuits 104, the bonding metal pads 108, and the functional devices 106 have a one-to-one relationship.

Consistent with the present disclosure, each of the bonding metal pads 108 includes one or more electrically conductive materials, such as one or more metals or alloys, and also serves as an electrical contact between the corresponding driver circuit 104 and functional device die 106 for transmitting electrical signals therebetween. For example, the bonding material for the bonding metal pads 108 can be tin (Sn), gold (Au), nickel (Ni), palladium (Pd), or copper (Cu), or an alloy of any two or more of these metals, such as Au—Sn metal alloy. Alternatively, each of the bonding metal pads 108 can include a composite layer having multiple sublayers each including one or more suitable bonding materials or alloys thereof. Moreover, each of the bonding metal pads 108 can also include, on either one or each of the side facing the driver circuit wafer 102 and the side facing the functional device epi-layer 105, an adhesion layer and/or a bonding diffusion barrier layer. The adhesion layer facilitates the adhesion between the bonding metal pad 108 and the driver circuit wafer 102 or the corresponding functional device die 106, and the bonding diffusion barrier layer helps to prevent or reduce diffusion of the bonding material(s).

In the present disclosure, the functional device dies 106 refer to semiconductor dies that can perform certain functions. The functional device dies 106 may be the same as or different from each other. According to the present disclosure, the functional device dies 106 are configured such that no part of a growth substrate, which is used for growing epitaxial layers that are used to form the functional device dies 106, remains in the functional device dies 106.

In some embodiments, the functional device dies 106 may be opto-electronic device dies, such as light-emitting device dies or light-absorbing device dies. The light-emitting device dies may be light-emitting diode (LED) dies. The light-emitting device dies may also be laser diode (LD) dies, such as edge emitting lasers (e.g., Fabry-Perot (FP) lasers, distributed feedback (DFB) lasers, or distributed Bragg reflector (DBR) lasers) or vertical cavity surface emitting lasers (VCSELs). Examples of the light-absorbing device dies include semiconductor photodetector dies and solar cells. If the functional device dies 106 are opto-electronic device dies, each of the functional device dies 106 includes an active region associated with a certain wavelength or a certain wavelength range, i.e., the active region is configured to emit or absorb light of a certain wavelength or a certain wavelength range. As noted above, the functional device dies 106 can be the same as or different from each other. Correspondingly, the active regions of different functional device dies 106 can be associated with the same or different wavelengths or wavelength ranges.

In some embodiments, if the functional device dies 106 include LED dies, each of the functional device dies 106 can include a roughened uppermost epitaxial layer. The upper surface of the uppermost epitaxial layer is roughened to improve light extraction from the LED die.

The functional device dies 106 are not limited to opto-electronic devices, but can be other types of electrical devices. For example, the functional device dies 106 can be micro-electro-mechanical system (MEMS) dies, such as MEMS sensors. The functional device dies 106 can also be power electronic device dies, such as insulated-gate bipolar transistor (IGBT) dies, Schottky barrier diode (SBD) dies, or junction barrier Schottky (JBS) rectifier dies.

Depending on the type of the functional device dies 106, the functional device epi-layer 105 may be made of different types of materials. For example, the functional device epi-layer 105 may include elemental semiconductors (e.g., silicon (Si) or germanium (Ge)). The functional device epi-layer 105 may also include compound semiconductors, such as II-VI compound semiconductors (e.g., zinc oxide (ZnO), zinc telluride (ZnTe), and zinc sulphide (ZnS)), III-V compound semiconductors (e.g., indium-phosphide (InP) based semiconductors such as InP, indium-gallium arsenide (InGaAs), and indium-gallium arsenide phosphide (InGaAsP), gallium-arsenide (GaAs) based semiconductors such as GaAs, aluminum-gallium arsenide (AlGaAs), and gallium arsenide antimonide (GaAsSb), or gallium-nitride (GaN) based semiconductors such as GaN, indium-gallium nitride (InGaN), and aluminum-gallium nitride (AlGaN)), or IV-IV compound semiconductors (e.g., silicon carbide (SiC) or Si—Ge alloy).

In the present disclosure, the driver circuit wafer 102 is also referred to as a "driver circuit substrate" or a "carrier wafer." The driver circuit wafer 102 may include a semiconductor substrate, such as an amorphous semiconductor substrate, a polycrystalline semiconductor substrate, or a single crystalline semiconductor substrate. For example, the driver circuit wafer 102 can include a single crystalline silicon (Si) substrate or a single crystalline III-V compound semiconductor substrate. In some embodiments, the driver circuit wafer 102 may include one or more dielectric layers (not shown), such as silicon dioxide ($SiO_2$) layers, formed over the semiconductor substrate. Wirings and/or contacts of the driver circuits 104 may be formed in or over the one or more dielectric layers.

Depending on the type of the functional device dies 106, the driver circuits 104 may include different types of devices. For example, each of the driver circuits 104 may include a single semiconductor device such as a metal-oxide-semiconductor field-effect transistor (MOSFET), a thin-film-transistor (TFT), a high-electron-mobility transistor (HEMT), a heterojunction bipolar transistor (HBT), a metal-semiconductor FET (MESFET), or a metal-insulator-semiconductor FET (MISFET), or an integrated circuit including two or more of any type of the above-listed devices.

FIG. 1 is a high-level schematic view of the semiconductor apparatus 100. Each of the driver circuits 104 or the functional device dies 106 is illustrated as a single block in FIG. 1, but can include multiple components such as contacts and different material layers. Moreover, the semiconductor apparatus 100 consistent with the present disclosure also includes other components, such as wirings, isolation layers, and/or passivation layers, which may be part of the driver circuit wafer 102 and/or part of the functional device epi-layer 105, or may be components in addition to the driver circuit wafer 102, the functional device epi-layer 105, and the bonding metal layer 107. These other components are not explicitly illustrated in FIG. 1, and may also not be explicitly illustrated in other drawings of the present disclosure. According to the present disclosure, since the functional device dies 106 in the semiconductor apparatus 100 do not have any part of the growth substrate remaining on top of them, the other components related to the functional device dies 106, such as the wirings and passivation layers for the functional device dies 106, can be formed directly on the uppermost epitaxial layer in each of the functional device dies 106.

Figure 2A:
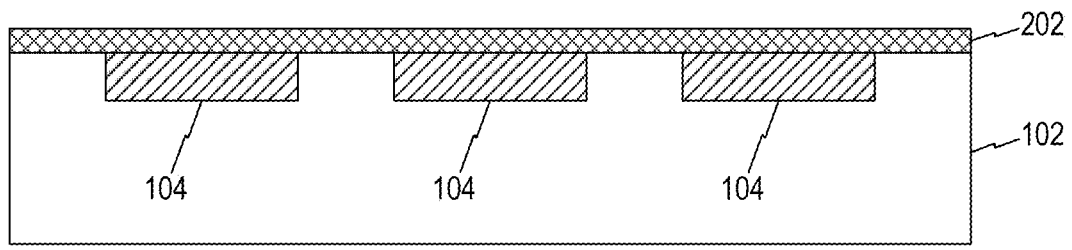
FIGS. 2A-2E schematically show a process for manufacturing the semiconductor apparatus of FIG. 1 according to an exemplary embodiment.

FIGS. 2A-2E schematically show an exemplary process for manufacturing the semiconductor apparatus 100 consistent with embodiments of the present disclosure. As shown in FIG. 2A, a first pre-bonding metal layer 202 is formed over the driver circuit wafer 102, in which the driver circuits 104 were previously formed. The first pre-bonding metal layer 202 includes a bonding material sublayer containing, for example, Sn, Au, Ni, Pd, or Cu, or an alloy thereof. The bonding material sublayer may also include a multi-layer structure having a plurality of layers of one or more bonding materials. In some embodiments, the first pre-bonding metal layer 202 can also include an adhesion sublayer and/or a bonding diffusion barrier sublayer formed between the bonding material sublayer and the driver circuit wafer 102. The adhesion sublayer is configured to enhance the adhesion between the bonding material sublayer and the driver circuit wafer 102, while the bonding diffusion barrier sublayer is configured to prevent or reduce diffusion of the bonding material(s).

Figure 2B:
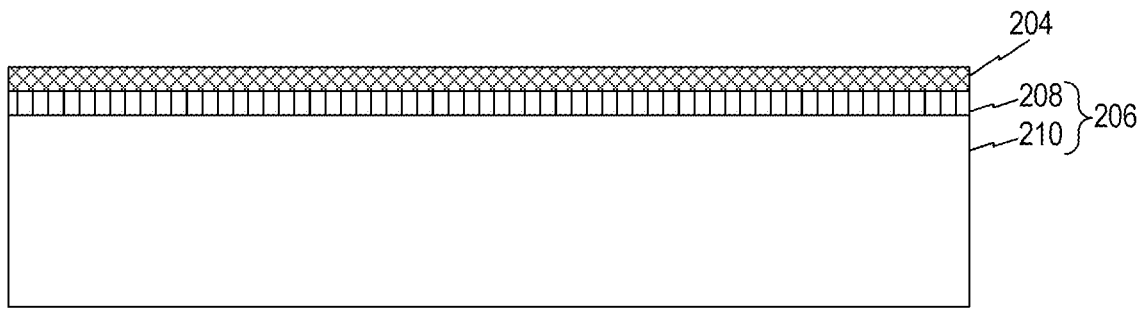

Referring to FIG. 2B, separate from the driver circuit wafer 102, a second pre-bonding metal layer 204 is formed over a functional device wafer 206. The second pre-bonding metal layer 204 includes a bonding material sublayer containing, for example, Sn, Au, Ni, Pd, or Cu, or an alloy thereof. The bonding material sublayer may also include a multi-layer structure having a plurality of layers of one or more bonding materials. In some embodiments, the second pre-bonding metal layer 204 can also include an adhesion sublayer and/or a bonding diffusion barrier sublayer formed between the bonding material sublayer and the functional device wafer 206. The adhesion sublayer is configured to enhance the adhesion between the bonding material sublayer and the functional device wafer 206, while the bonding diffusion barrier sublayer is configured to prevent or reduce diffusion of the bonding material(s). In the present disclosure, the functional device wafer 206 is also referred to as an "epi wafer." The functional device wafer 206 includes a functional device epi-structure layer 208, which is also referred to as an "epi-structure layer," epitaxially grown on a growth substrate 210. Depending on the type of the functional device dies 106 to be formed as discussed above, the epi-structure layer 208 can include different epitaxial structures that are suitable for forming the final functional device dies 106. For example, the epi-structure layer 208 can include an opto-electronic device epi-structure layer, such as an LED epi-structure layer, a VCSEL epi-structure layer, or a photodetector epi-structure layer. As another example, the epi-structure layer 208 can include a MEMS epi-structure layer, such as a MEMS sensor epi-structure layer.

The growth substrate 210 can be any substrate that is suitable for the epitaxial growth of the epi-structure layer 208, and is separately provided. For example, if the epi-structure layer 208 includes a GaN-based material, the growth substrate 210 can be a sapphire substrate, such as a patterned sapphire substrate, or can be a SiC substrate. As another example, if the epi-structure layer 208 includes an InP-based material, the growth substrate 210 can be an InP substrate. As a further example, if the epi-structure layer 208 includes a GaAs-based material, the growth substrate 210 can be a GaAs substrate.

Figure 2C:
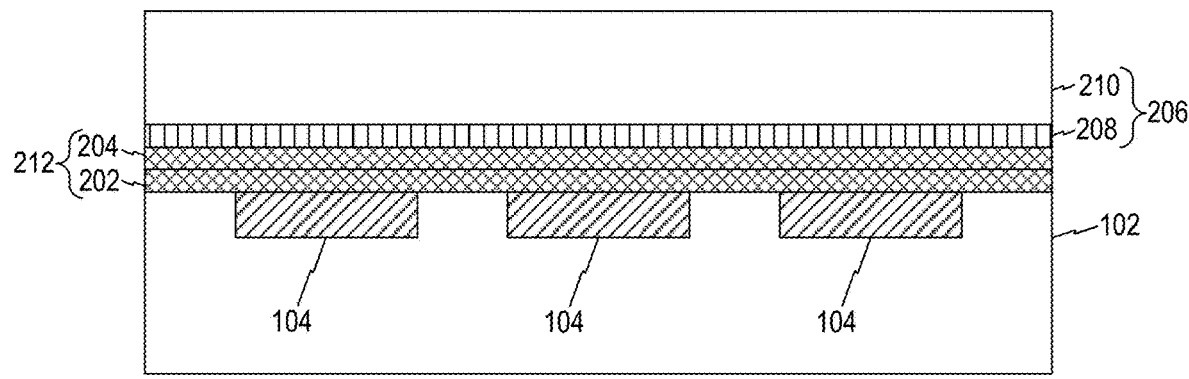

Referring to FIG. 2C, the functional device wafer 206 having the second pre-bonding metal layer 204 formed thereon is transferred over and aligned with the driver circuit wafer 102 having the first pre-bonding metal layer 202 formed thereon (shown in FIG. 2A), with the second pre-bonding metal layer 204 facing the first pre-bonding metal layer 202. The functional device wafer 206 is brought into contact with the driver circuit wafer 102, such that the second pre-bonding metal layer 204 contacts and is pressed against the first pre-bonding metal layer 202. A bonding process is conducted to bond the first and second pre-bonding metal layers 202 and 204 to each other to form an unpatterned bonding metal layer 212. In some embodiments, the bonding process includes heating at an elevated temperature such that at least a portion of the first pre-bonding metal layer 202 and at least a portion of the second pre-bonding metal layer 204 melt and the first and second pre-bonding metal layers 202 and 204 are welded to each other. The temperature at which the bonding process is conducted depends on the bonding material(s) used, and can, for example, range from about 230° C. to higher than 350° C. when Au—Sn alloy is used as the bonding material. Other bonding techniques can also be applied as long as they can bond the first and second pre-bonding metal layers 202 and 204 together.

Figure 2D:
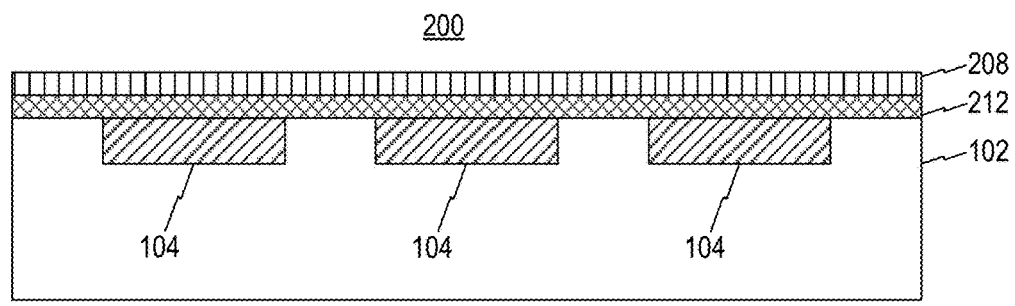

After the first and second pre-bonding metal layers 202 and 204 are bonded together to form the unpatterned bonding metal layer 212, the growth substrate 210 is removed to expose the epi-structure layer 208, as shown in FIG. 2D. The growth substrate 210 can be removed using any suitable physical or chemical substrate removing technique, such as laser lift-off, chemical-mechanical polishing (CMP), or wet etching.

After the growth substrate 210 is removed, the remaining parts constitute another exemplary semiconductor apparatus 200 consistent with embodiments of the present disclosure. That is, the semiconductor apparatus 200 is an intermediate product formed during the process of forming the semiconductor apparatus 100. The semiconductor apparatus 200 includes the driver circuit wafer 102 having the plurality of driver circuits 104 arranged in an array, the unpatterned bonding metal layer 212 formed over the driver circuit wafer 102, and the epi-structure layer 208 formed over the unpatterned bonding metal layer 212. In particular, like the semiconductor apparatus 100, the semiconductor apparatus 200 does not include the growth substrate 210, and therefore the epi-structure layer 208 is exposed to the environment. Different from the semiconductor apparatus 100, the semiconductor apparatus 200 has a horizontally continuous unpatterned bonding metal layer 212 and a horizontally continuous epi-structure layer 208.

Figure 2E:
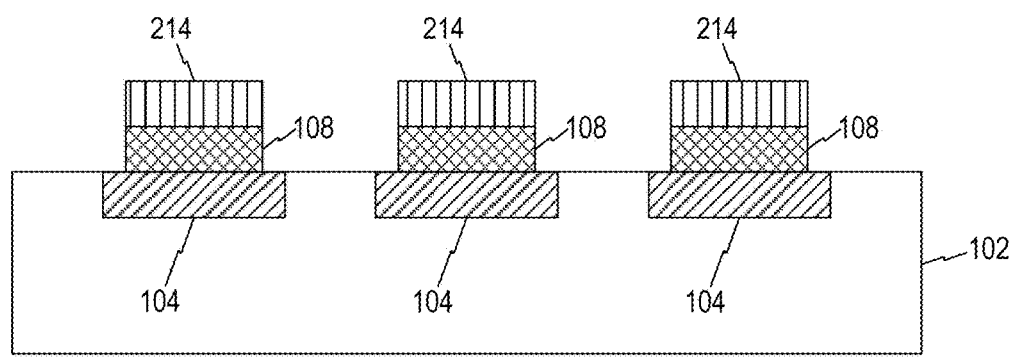

Consistent with the present disclosure, after the growth substrate 210 is removed, the epi-structure layer 208 and the unpatterned bonding metal layer 212 can be patterned, for example, using a photo-lithography method, to form functional device mesas 214 and the bonding metal pads 108, respectively, as shown in FIG. 2E. Details of this patterning process are omitted here. In some embodiments, the functional device mesas 214 may be the functional device dies 106, so that the semiconductor apparatus shown in FIG. 2E, which results from the exemplary process described above, is equivalent to the semiconductor apparatus 100 shown in FIG. 1. In some embodiments, further processing may be performed to form the functional device dies 106 from the functional device mesas 214, so as to form the semiconductor apparatus 100 shown in FIG. 1. Moreover, following the patterning process, other processes can be conducted to, for example, form wirings, insulation layers, and/or passivation layers, or to roughen upper surfaces of the functional device dies 106 to improve light extraction in the case of, e.g., LED dies. Descriptions of such processes are also omitted here.

FIGS. 3A-3D schematically show another exemplary process for manufacturing the semiconductor apparatus 100 consistent with embodiments of the present disclosure. In this exemplary process, the steps of forming the first and second pre-bonding metal layers 202 and 204 over the driver circuit wafer 102 and the functional device wafer 206, respectively, are similar to those described above in connection with FIGS. 2A and 2B. Therefore, these two steps are not illustrated again in FIGS. 3A-3D, and the descriptions thereof are omitted.

Figure 3A:
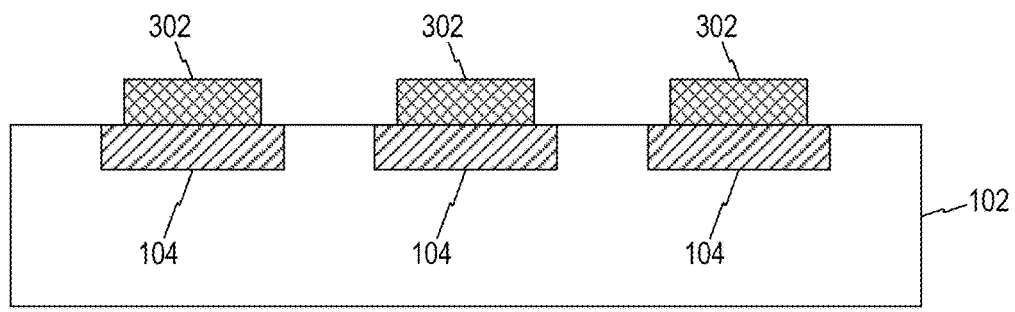
FIGS. 3A-3D schematically show a process for manufacturing the semiconductor apparatus of FIG. 1 according to another exemplary embodiment.

Referring to FIG. 3A, the first pre-bonding metal layer 202 is patterned to form first pre-bonding metal pads 302. The first pre-bonding metal pads 302 are arranged in an array. Each of the first pre-bonding metal pads 302 corresponds to and is electrically coupled to one of the driver circuits 104. In some embodiments, one first pre-bonding metal pad 302 corresponds to only one driver circuit 104.

According to the present disclosure, the first pre-bonding metal layer 202 can be patterned using any suitable patterning method. For example, the first pre-bonding metal layer 202 can be patterned using a photo-lithography method, during which the first pre-bonding metal layer 202 is etched to remove portions thereof, so as to form the first pre-bonding metal pads 302. Alternatively, the first pre-bonding metal layer 202 can be patterned using a lift-off method. To pattern the first pre-bonding metal layer 202 by the lift-off method, a layer of a material suitable for lift-off (not shown in the drawings), such as a photoresist layer, can be formed over the driver circuit wafer 102 and be patterned before the first pre-bonding metal layer 202 is formed. In this scenario, the first pre-bonding metal layer 202 is formed over the patterned lift-off material layer. The patterned lift-off material layer is then removed along with the portions of the first pre-bonding metal layer 202 that are formed directly on the lift-off material layer. The remaining portions of the first pre-bonding metal layer 202 form the first pre-bonding metal pads 302.

Figure 3B:
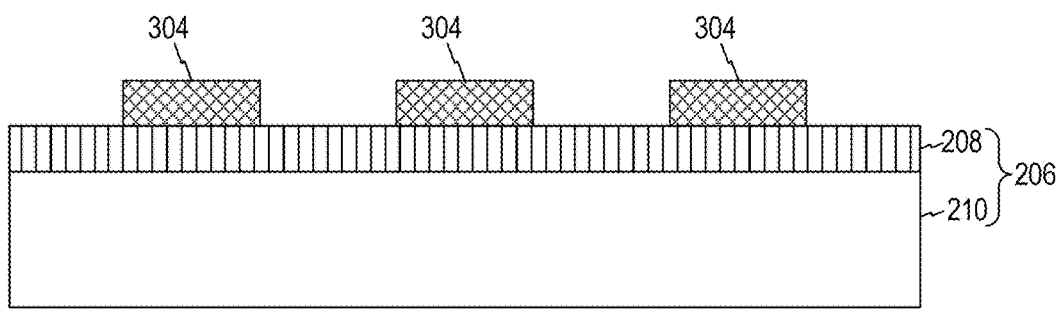

Referring to FIG. 3B, the second pre-bonding metal layer 204 is patterned to form second pre-bonding metal pads 304 that are arranged in an array. Each of the second pre-bonding metal pads 304 corresponds to one of the first pre-bonding metal pads 302, and also corresponds to one of the functional device dies 106 to be formed. Consistent with the present disclosure, the second pre-bonding metal layer 204 can be patterned using a method similar to that used to pattern the first pre-bonding metal layer 202, e.g., the second pre-bonding metal layer 204 can be patterned by etching or lift-off.

Figure 3C:
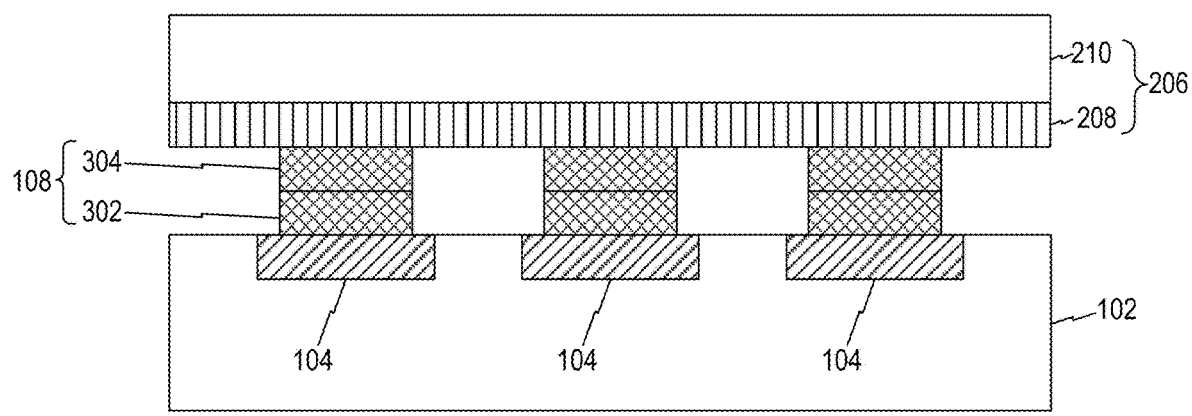

After the first and second pre-bonding metal layers 202 and 204 are patterned, the functional device wafer 206 is transferred over and aligned with the driver circuit wafer 102, with the second pre-bonding metal pads 304 facing corresponding ones of the first pre-bonding metal pads 302, as shown in FIG. 3C. Each of the second pre-bonding metal pads 304 is aligned with one of the first pre-bonding metal pads 302. The functional device wafer 206 is brought into contact with the driver circuit wafer 102, such that the second pre-bonding metal pads 304 contact and are pressed against their corresponding first pre-bonding metal pads 302. A bonding process similar to that described with respect to FIG. 2C is conducted to bond the second pre-bonding metal pads 304 with the first pre-bonding metal pads 302 to form the bonding metal pads 108.

Figure 3D:
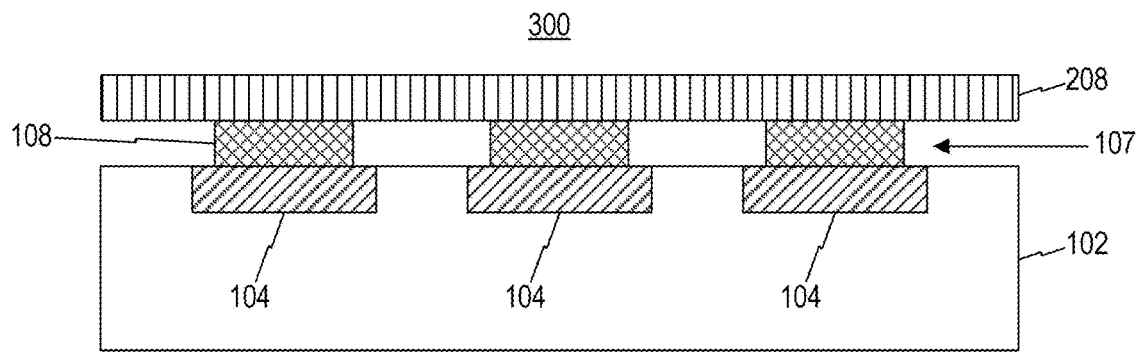

After the first and second pre-bonding metal pads 302 and 304 are bonded together to form the bonding metal layer 107 having the bonding metal pads 108, the growth substrate 210 is removed to expose the epi-structure layer 208, as shown in FIG. 3D.

After the growth substrate 210 is removed, the remaining parts constitute another exemplary semiconductor apparatus 300 consistent with embodiments of the present disclosure. That is, the semiconductor apparatus 300 is another intermediate product formed during the process of forming the semiconductor apparatus 100. The semiconductor apparatus 300 includes the driver circuit wafer 102 having the plurality of driver circuits 104 arranged in an array, the bonding metal layer 107 formed over the driver circuit wafer 102 and having the bonding metal pads 108 arranged in an array, and the epi-structure layer 208 formed over the bonding metal layer 107. In particular, like the semiconductor apparatus 100, the semiconductor apparatus 300 does not include the growth substrate 210, and therefore the epi-structure layer 208 is exposed to the environment. Different from the semiconductor apparatus 100, the semiconductor apparatus 300 has a horizontally continuous epi-structure layer 208.

Consistent with the present disclosure, after the growth substrate 210 is removed, the epi-structure layer 208 can be patterned, for example, using a photo-lithography method, to form the functional device mesas 214, resulting in a semiconductor apparatus similar to that shown in FIG. 2E, which is thus not shown again. Details of patterning the epi-structure layer 208 are omitted here.

Figure 4A:
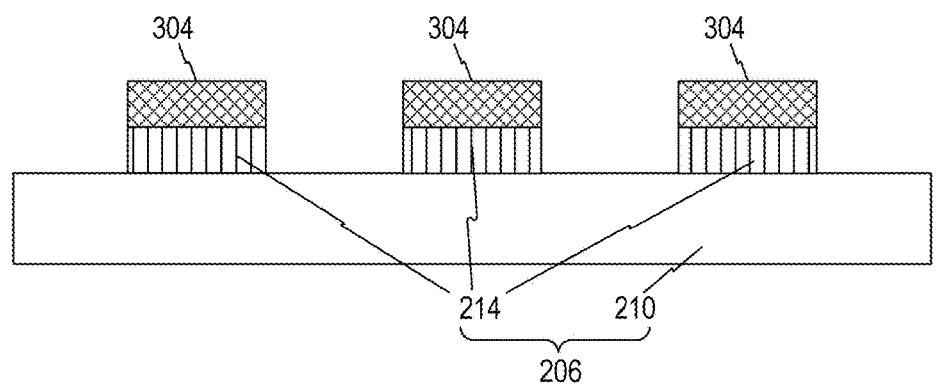
FIGS. 4A and 4B schematically show a process for manufacturing the semiconductor apparatus of FIG. 1 according to another exemplary embodiment.
Figure 4B:
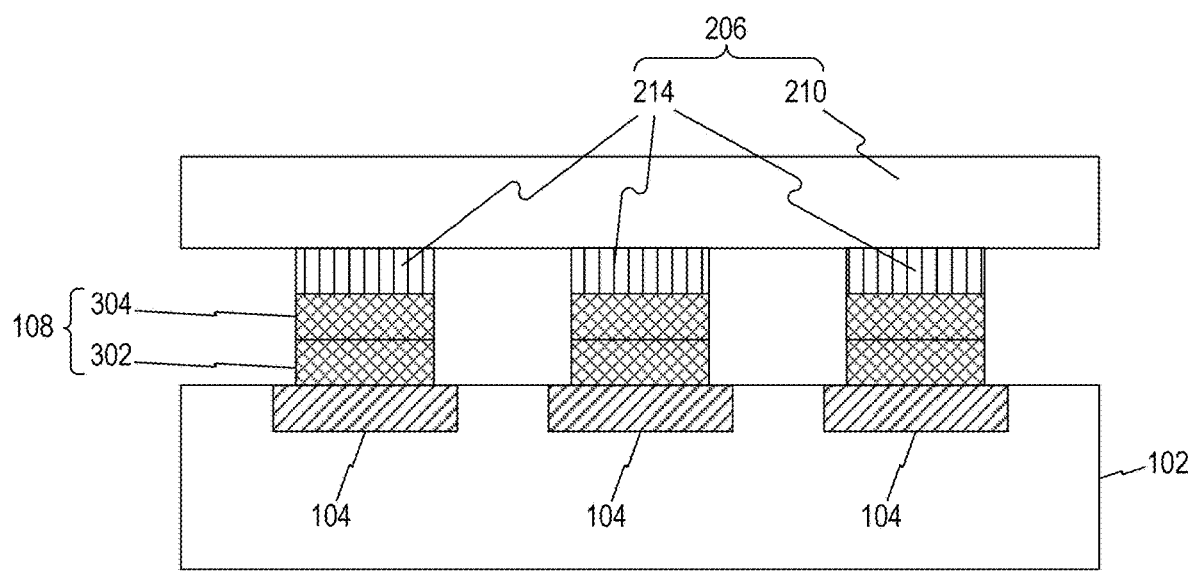

FIGS. 4A and 4B schematically show another exemplary process for manufacturing the semiconductor apparatus 100 consistent with embodiments of the present disclosure. In this exemplary process, the steps of forming the first and second pre-bonding metal layers 202 and 204, and the steps of patterning the first and second pre-bonding metal layers 202 and 204 to form the first and second pre-bonding metal pads 302 and 304 are similar to those described above in connection with FIGS. 2A, 2B, 3A, and 3B. Therefore, these steps are not illustrated again in FIGS. 4A and 4B, and the descriptions thereof are omitted.

Referring to FIG. 4A, the epi-structure layer 208 is patterned to form the functional device mesas 214. For example, the epi-structure layer 208 can be patterned by etching using the second pre-bonding metal pads 304 as masks. As another example, the epi-structure layer 208 can be patterned by a separate photolithography process, which includes, e.g., forming a photoresist layer over the epi-structure layer 208 and the second pre-bonding metal pads 304, patterning the photoresist layer to remove portions of the photoresist layer with remaining portions over the second pre-bonding metal pads 304, and then etching the epi-structure layer 208 using the remaining portions of the photoresist layer as masks. Each of the remaining portions of the photoresist layer may have a larger area than the corresponding second pre-bonding metal pad 304, and thus each of the functional device mesas 214 formed by the above second exemplary process may have a larger area than the corresponding second pre-bonding metal pad 304, although the larger area is not explicitly illustrated in FIG. 4A.

Then, as shown in FIG. 4B, the functional device wafer 206 is bonded with the driver circuit wafer 102. A bonding process similar to that described above in connection with FIG. 3C is conducted to bond the functional device wafer 206 and the driver circuit wafer 102.

After the functional device wafer 206 and the driver circuit wafer 102 are bonded together, the growth substrate 210 is removed to expose the functional device mesas 214, resulting in a semiconductor apparatus similar to that shown in FIG. 2E, which is thus not shown again.

In the exemplary process described above in connection with FIGS. 4A and 4B, the second pre-bonding metal layer 204 is first formed and patterned to form the second pre-bonding metal pads, and the epi-structure layer 208 is patterned thereafter. In some embodiments, the epi-structure layer 208 can be patterned before the second pre-bonding metal layer 204 is formed over the functional device wafer 206. This exemplary process is described below in connection with FIGS. 5A and 5B.

In this exemplary process, the steps of forming and patterning the first pre-bonding metal layer 202 are similar to those described above in connection with FIGS. 2A and 3A. Therefore, these steps are not illustrated again in FIGS. 5A and 5B, and the descriptions thereof are omitted.

Figure 5A:
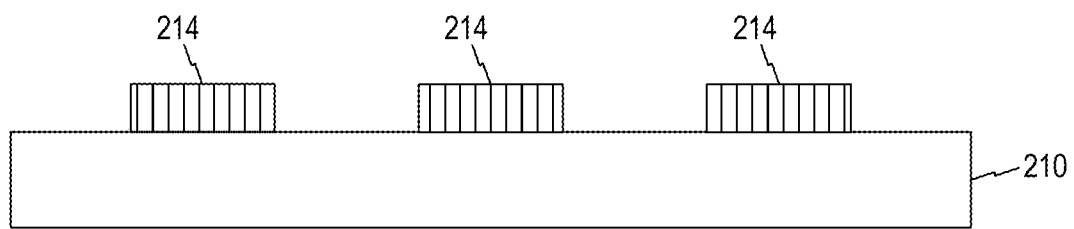
FIGS. 5A-5B schematically show a process for manufacturing the semiconductor apparatus of FIG. 1 according to another exemplary embodiment.
Figure 5B:
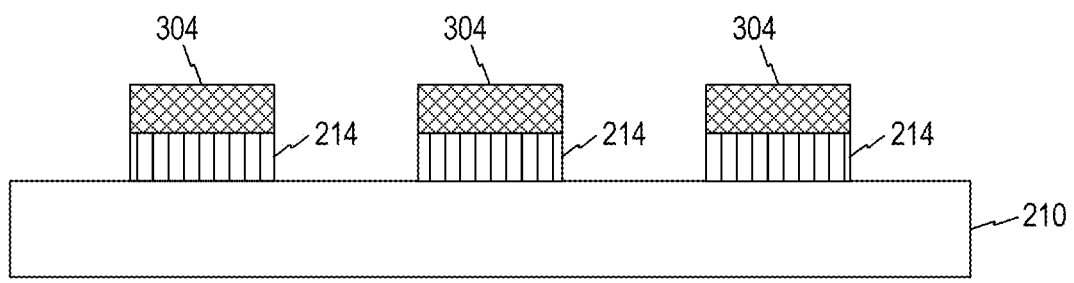

Referring to FIG. 5A, the epi-structure layer 208 is patterned, for example, using a photolithography method, to form the functional device mesas 214. Then, as shown in FIG. 5B, the second pre-bonding metal pads 304 are formed over the functional device mesas 214. For example, forming the second pre-bonding metal pads 304 can include first depositing the pre-bonding metal layer 204 (not shown in FIG. 5B) and then patterning the pre-bonding metal layer 204 to form the second pre-bonding metal pads 304. The subsequent processing steps of this exemplary process are similar to those described above in connection with FIG. 4B, and thus are not illustrated and descriptions thereof are omitted.

In the exemplary process described above in connection with FIGS. 2A-2E, both the first and second pre-bonding metal layers 202 and 204 are patterned after the driver circuit wafer 102 and the functional device wafer 206 are bonded together, while in the exemplary processes described above in connection with FIGS. 3A-5B, both the first and second pre-bonding metal layers 202 and 204 are patterned before the driver circuit wafer 102 and the functional device wafer 206 are bonded together. In other embodiments, either one of the first pre-bonding metal layer 202 or the second pre-bonding metal layer 204 can be patterned before the bonding process and the other one can be patterned after the bonding process.

Figure 6A:
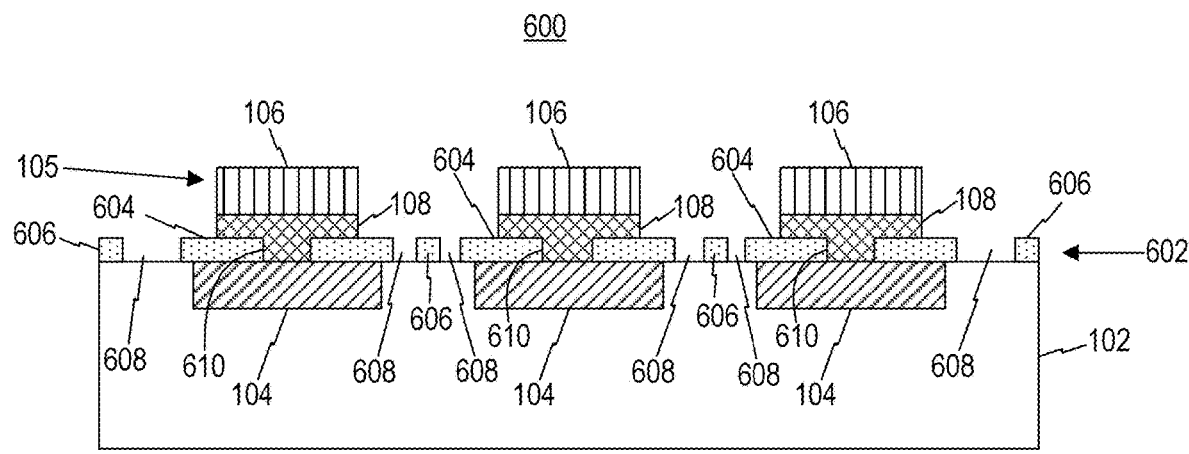
FIGS. 6A and 6B schematically show a semiconductor apparatus according to another exemplary embodiment.
Figure 6B:
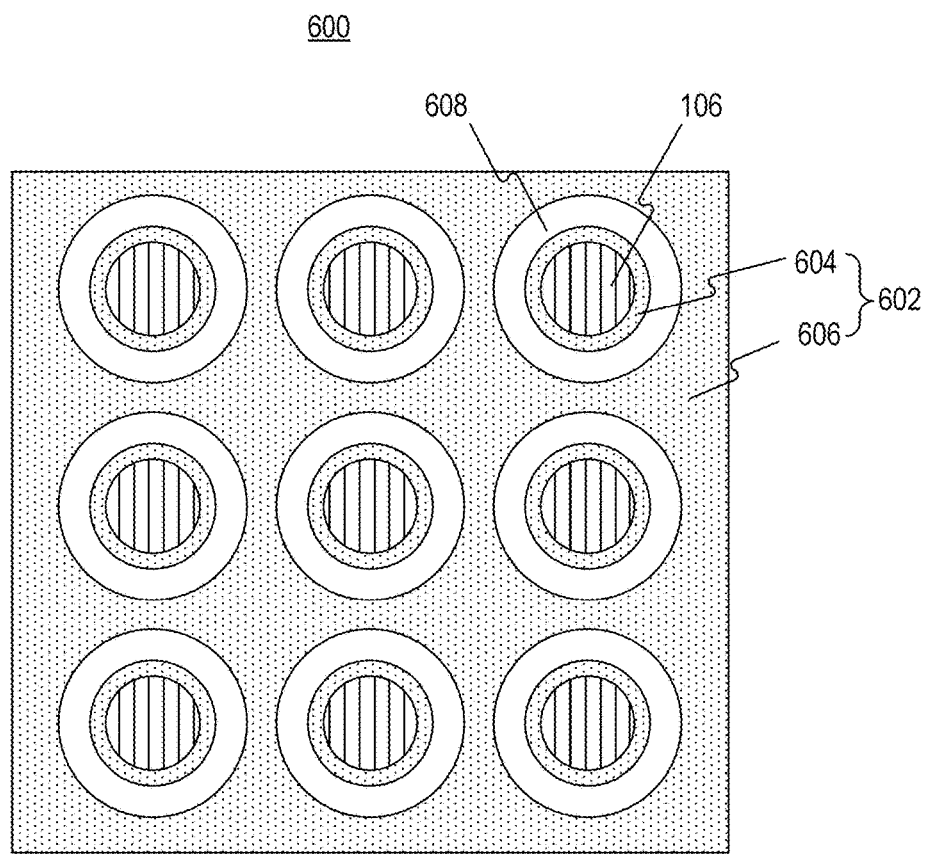

In the exemplary processes described above in connection with FIGS. 3A-5B, the first and second pre-bonding metal pads 302 and 304 are formed before the bonding process. The first pre-bonding metal pads 302 are physically and electrically separated from each other. Similarly, the second pre-bonding metal pads 304 are physically and electrically separated from each other. However, during the bonding process, portions of the first and second pre-bonding metal pads 302 and 304 may melt and, under the pressure exerted during the bonding process, the melt metal from the first and/or second pre-bonding metal pads 302, 304 may flow along the surface of the driver circuit wafer 102 and reach neighboring first and/or second pre-bonding metal pads 302, 304, causing a short circuit in the resulting semiconductor apparatus. To avoid this issue, structures preventing the melt metal from reaching neighboring first and/or second pre-bonding metal pads 302, 304 can be formed in the semiconductor apparatus. FIGS. 6A and 6B schematically show an exemplary semiconductor apparatus 600 having such structures consistent with embodiments of the present disclosure.

FIG. 6A is a cross-sectional view schematically showing the semiconductor apparatus 600, which is similar to the semiconductor apparatus 100, except that the semiconductor apparatus 600 further includes a dielectric isolation layer 602 arranged between the driver circuit wafer 102 and the functional device epi-layer 105. The dielectric isolation layer 602 includes first protrusion structures 604 and second protrusion structures 606 surrounding the first protrusion structures 604. As shown in FIG. 6A, each of the first protrusion structures 604 is formed over one of the driver circuits 104, and each of the bonding metal pads 108 is formed over one of the first protrusion structures 604. That is, each of the first protrusion structures 604 "holds" one bonding metal pad 108, and thus the first protrusion structures 604 are also referred to in this disclosure as "bonding metal pad plateaus" or "solder pad plateaus."

FIG. 6B is a plan view of the semiconductor apparatus 600, showing the second protrusion structures 606 surrounding each of the first protrusion structures 604 and separating neighboring first protrusion structures 604 from each other. As shown in FIGS. 6A and 6B, each of the first protrusion structures 604 and the corresponding neighboring second protrusion structures 606 define a recess 608 surrounding the first protrusion structure 604. During the bonding process, if melt bonding metal outflows from the first protrusion structures 604, it is contained in the recesses 608 and confined by the second protrusion structures 606, and does not reach neighboring bonding metal pads 108. Thus, the recesses 608 are also referred to in this disclosure as "bonding metal reservoirs" or "solder reservoirs," and the second protrusion structures 606 are also referred to as "bonding metal confinement dams" or "solder confinement dams."

Referring again to FIG. 6A, each of the first protrusion structures 604 includes a through hole 610 formed between the upper surface and the lower surface of that first protrusion structure 604. At least a portion of the corresponding bonding metal pad 108 is formed in the through hole 610, forming an electrical path to the corresponding driver circuit 104 located beneath the first protrusion structure 604.

Consistent with the present disclosure, the dielectric isolation layer 602 can also be included in the semiconductor apparatus 300, in a manner similar to that shown in FIGS. 6A and 6B and described above.

Figure 7A:
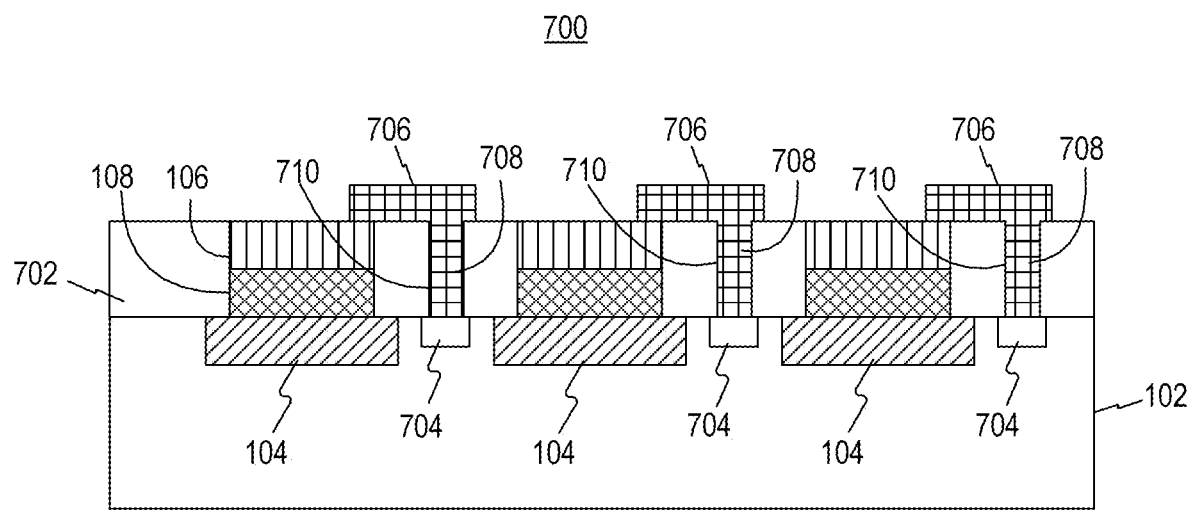
FIGS. 7A and 7B schematically show a semiconductor apparatus according to another exemplary embodiment.
Figure 7B:
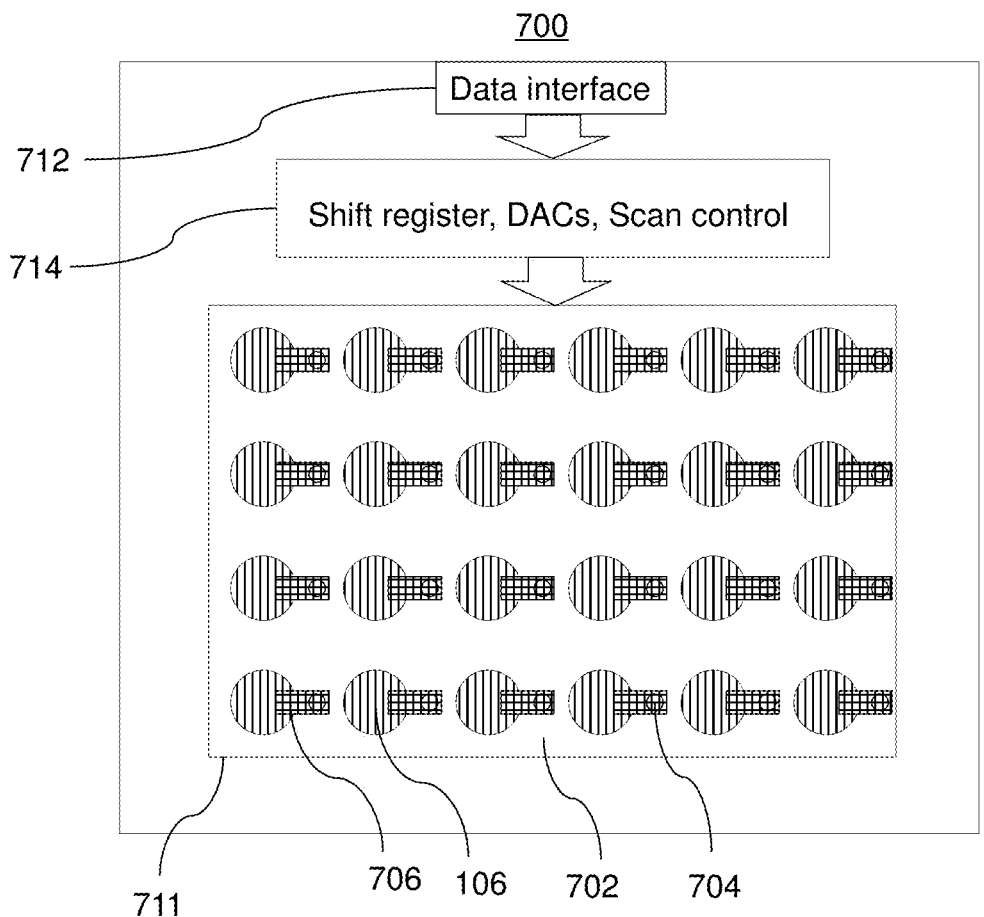

As described above, the functional device dies 106 are spatially separated from each other. In some embodiments, an isolation layer may be formed between the functional device dies 106. FIGS. 7A and 7B schematically show another exemplary semiconductor apparatus 700 consistent with embodiments of the present disclosure. The semiconductor apparatus 700 is similar to the semiconductor apparatus 100, except that the semiconductor apparatus 700 further includes an isolation layer 702 formed between the functional device dies 106. FIG. 7A is a cross-sectional view schematically showing the semiconductor apparatus 700. In the example shown in FIG. 7A, the top surface of the isolation layer 702 is flat or approximately flat, and is flush or approximately flush with top surfaces of the functional device dies 106. However, the isolation layer 702 can be higher or lower than the functional device dies 106. Consistent with the present disclosure, the isolation layer 702 can be formed of, for example, a dielectric material to improve the electrical isolation between neighboring functional device dies 106.

As noted above, the functional device dies 106 can be opto-electronic device dies that can emit or absorb light of a certain wavelength. The spatial separation among the opto-electronic device dies can ensure good optical isolation between neighboring opto-electronic device dies. Such an optical isolation can, for example, reduce cross-talk between the neighboring opto-electronic device dies. The optical isolation can be further improved by choosing a suitable material for the isolation layer 702 in the semiconductor apparatus 700. That is, the isolation layer 702 can be formed of a material that further reduces light transmission between neighboring opto-electronic device dies. For example, the material can be a light absorptive material that can absorb light having a wavelength associated with an opto-electronic device die, such as an LED die. In the present disclosure, a wavelength or a wavelength range associated with a die or a layer refers to a wavelength or a wavelength range of light emitted or absorbed by the die or the layer. The absorptive material can be a material having a lower transparency than air. In some embodiments, the isolation layer 702 is formed of a material that is non-transparent to light having a wavelength associated with the opto-electronic device dies. For example, if the opto-electronic device dies include LED dies that emit blue light, a material non-transparent to blue light can be chosen to form the isolation layer 702. Alternatively, the isolation layer 702 can include a reflective material that can reflect light having a wavelength associated with an opto-electronic device die, such as an LED die. For example, the reflective material may reflect the light emitted by an LED die back to that LED die. The reduced-transparency (absorptive) material or the reflective material increases the optical confinement of individual opto-electronic device dies and enhances the optical isolation.

In some embodiments, in the scenario that the functional device dies 106 include opto-electronic device dies, the isolation layer 702 does not need to completely fill in the space between neighboring opto-electronic device dies, but can be formed as conformal layers on the sidewalls of the opto-electronic device dies, especially if the isolation layer 702 is formed of a reflective material.

In some embodiments, as shown in FIG. 7A, the semiconductor apparatus 700 further includes a plurality of ground pads 704, also referred to as "ground electrodes," formed in a dielectric layer (not shown) in the driver circuit wafer 102. Each of the ground pads 704 is associated with one of the driver circuits 104 and provides a ground level to the associated driver circuit 104. The ground pads 704 are electrically coupled to each other and to a common ground (not shown) of the semiconductor apparatus 700.

As shown in FIG. 7A, the semiconductor apparatus 700 further includes a plurality of metal wirings 706 formed over the isolation layer 702. Each of the metal wirings 706 contacts a portion of the top surface of a corresponding functional device die 106, and is electrically coupled to the corresponding functional device die 106. For example, each of the metal wirings 706 can be in direct contact with the uppermost epitaxial layer in the corresponding functional device die 106. Moreover, each of the metal wirings 706 includes a plug portion 708 formed in a wiring through hole 710 formed in the isolation layer 702. Each of the metal wirings 706 contacts and is electrically coupled to a corresponding ground pad 704 via the plug portion 708 of the metal wiring 706. Thus, the metal wirings 706 form a cross-connected metal layer.

FIG. 7B is a plan view of the semiconductor apparatus 700, schematically showing the wiring of the semiconductor apparatus 700 in a functional device area 711 containing the functional device dies 106. Moreover, as shown in FIG. 7B, the semiconductor apparatus 700 further includes a data interface 712 for receiving and/or outputting data, e.g., input data used to control the operations of the functional device dies 106 or output data generated by the functional device dies 106. The semiconductor apparatus 700 also includes a control portion 714 coupled between the data interface 712 and the functional device area 711. The control portion 712 may include, for example, one or more shift registers, one or more digital-analog converters (DACs), and/or one or more scan controllers.

Figure 8A:
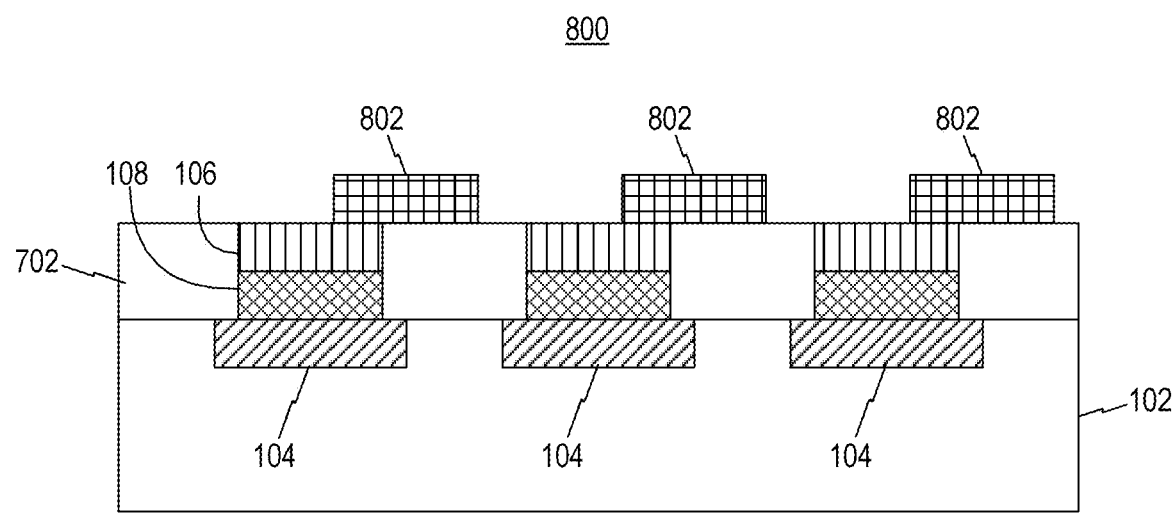
FIGS. 8A and 8B schematically show a semiconductor apparatus according to another exemplary embodiment.
Figure 8B:
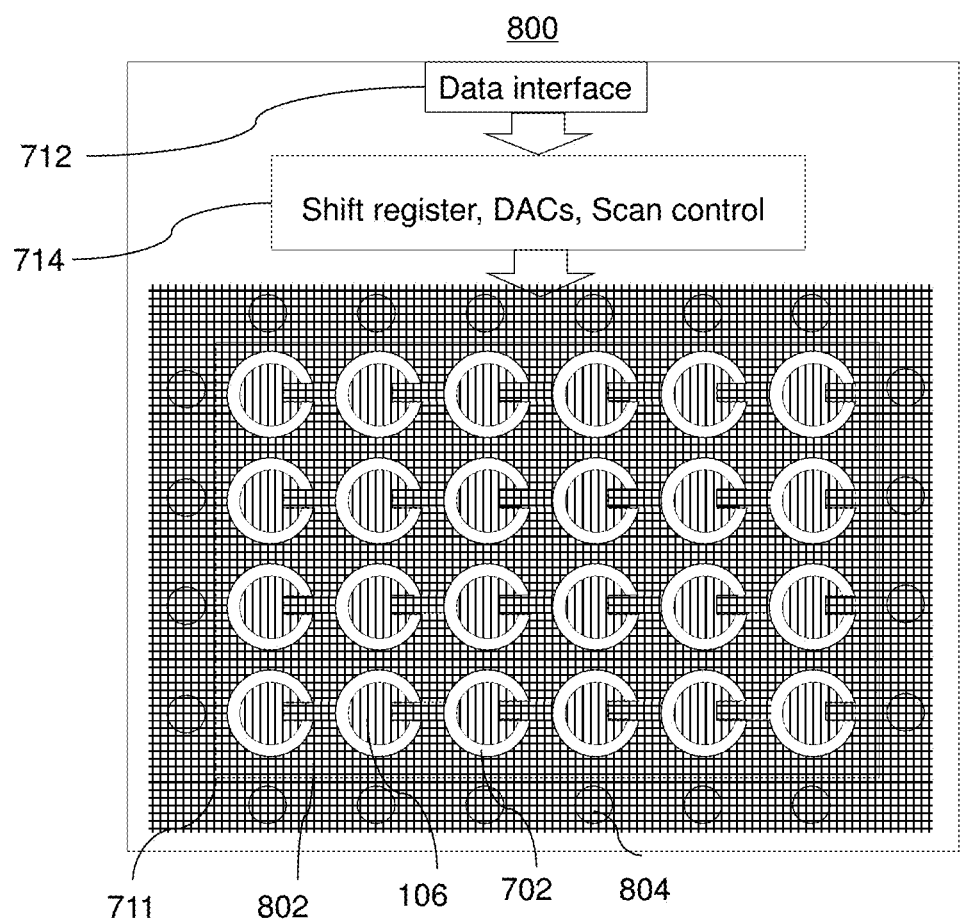

In the semiconductor apparatus 700, the metal wirings 706 contact and are electrically coupled to the ground pads 704, each of which is associated with one of the driver circuits 104. FIGS. 8A and 8B are cross-sectional and plan views, respectively, of another exemplary semiconductor apparatus 800 consistent with embodiments of the present disclosure. As shown in FIGS. 8A and 8B, the semiconductor apparatus 800 includes a continuous wiring layer 802 formed over the isolation layer 702. The wiring layer 802 contacts and is electrically coupled to each of the functional device dies 106. For example, the wiring layer 802 can be in direct contact with the uppermost epitaxial layer in each of the functional device dies 106. The wiring layer 802 is further electrically coupled to ground pads 804 formed in a peripheral region surrounding the functional device area 711, as shown in FIG. 8B.

Figure 9:
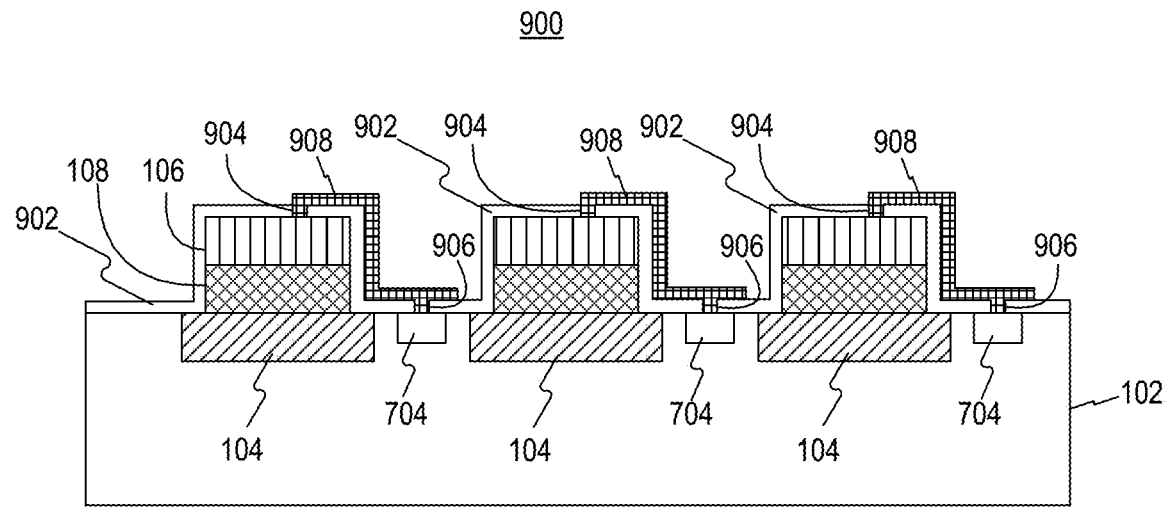
FIG. 9 schematically shows a semiconductor apparatus according to another exemplary embodiment.

In some embodiments, a semiconductor apparatus consistent with the present disclosure does not include the above-described isolation layer 702, but instead has a conformal passivation layer formed all over the semiconductor apparatus. FIG. 9 is a cross-sectional view schematically showing such an exemplary semiconductor apparatus 900. The semiconductor apparatus 900 is similar to the semiconductor apparatus 100, except that the semiconductor apparatus 900 further includes a passivation layer 902. As shown in FIG. 9, the passivation layer 902 is conformally formed over the functional device dies 106, the bonding metal pads 108, and the exposed area of the driver circuit wafer 102. For example, the passivation layer 902 can be in direct contact with the uppermost epitaxial layer in each of the functional device dies 106.

In some embodiments, as shown in FIG. 9, the semiconductor apparatus 900, like the semiconductor apparatus 700, also includes the ground pads 704 formed in a dielectric layer (not shown) in the driver circuit wafer 102. Functional device contact openings 904 and ground contact openings 906 are formed through the passivation layer 902 in areas over the functional device dies 106 and the ground pads 704, respectively. Metal wirings 908 are formed over the passivation layer 902, each of which is electrically coupled to the upper surface of one of the functional device dies 106 and the corresponding ground pad 704.

In the above-described drawings, the functional device epi-layer 105, the bonding metal layer 107, and the driver circuit wafer 102 are shown one over another. In some embodiments, the semiconductor apparatus consistent with the present disclosure may further include one or more electrode layers. For example, the semiconductor apparatus may include a device side electrode layer formed between the functional device epi-layer 105 and the bonding metal layer 107. The device side electrode layer can be formed of one or more conducting materials, and include a plurality of device side electrodes. Each of the device side electrodes corresponds to one of the functional device dies 106 and one of the bonding metal pads 108, and provides an electrical path between the corresponding functional device die 106 and bonding metal pad 108.

The material(s) forming the device side electrode layer may be different for different types of functional device dies 106. For example, if the functional device dies 106 include LED dies, the device side electrode layer can include a reflecting layer formed over the bonding metal layer 107 and a transparent conducting material layer formed over the reflecting layer. The reflecting layer reflects the light generated by the LED dies, increasing the efficiency of the LED dies, and may include a reflecting material, such as Sn, aluminum (Al), silver (Ag), rhodium (Rd), copper (Cu), or Au, or a reflecting structure, such as DBR.

In some embodiments, the semiconductor apparatus may additionally or alternatively include a driver side electrode layer formed between the bonding metal layer 107 and the driver circuit wafer 102. The driver side electrode layer can be formed of one or more conducting materials, and include a plurality of driver side electrodes. Each of the driver side electrodes corresponds to one of the bonding metal pads 108 and one of the driver circuits 104, and provides an electrical path between the corresponding bonding metal pad 108 and driver circuit 104. Consistent with the present disclosure, the driver side electrode layer can be formed on the driver circuit wafer 102, or at least partially in a dielectric layer formed over or in the driver circuit wafer 102.

As discussed above, the semiconductor apparatus consistent with the present disclosure can include opto-electronic device dies and thus be an opto-electronic apparatus. The opto-electronic device dies in the same opto-electronic apparatus can have a similar structure and are associated with light having a similar wavelength or a similar wavelength range. In some embodiments, additional optical elements having different associated wavelengths or wavelength ranges may be formed in the opto-electronic apparatus for different opto-electronic device dies.

Figure 10:
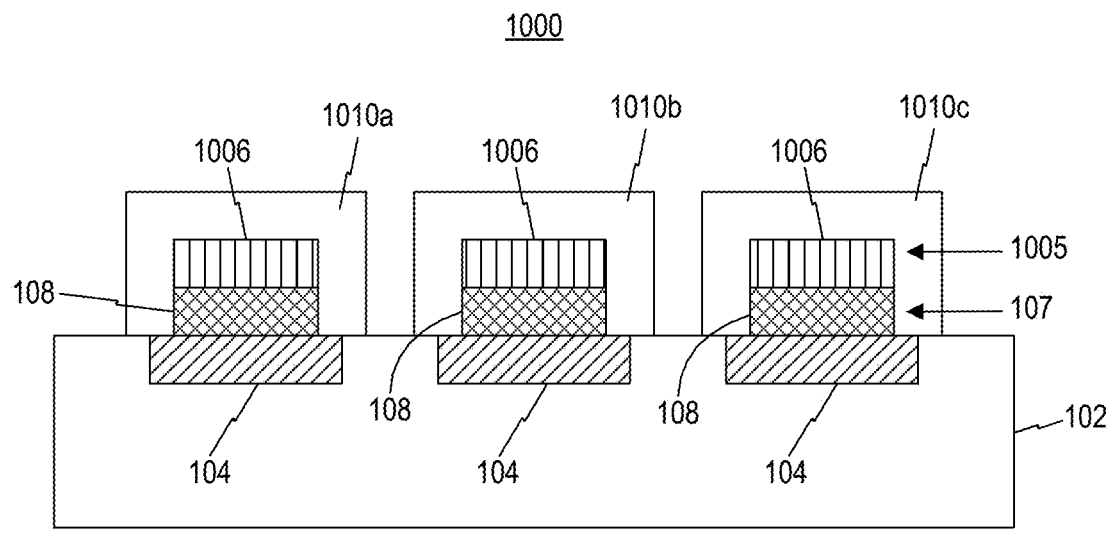
FIG. 10 schematically shows an opto-electronic apparatus according to an exemplary embodiment.

FIG. 10 is a cross-sectional view schematically showing an exemplary opto-electronic apparatus 1000 consistent with embodiments of the present disclosure. The opto-electronic apparatus 1000 includes the driver circuit wafer 102 having the driver circuits 104, the bonding metal layer 107 formed over the driver circuit wafer 102 and having the bonding metal pads 108, and an opto-electronic epi-layer 1005 formed over the bonding metal layer 107 and having a plurality of opto-electronic device dies 1006. The opto-electronic apparatus 1000 further includes a first optical element 1010a, a second optical element 1010b, and a third optical element 1010c. As shown in FIG. 10, each of the first, second, and third optical elements 1010a, 1010b, and 1010c is formed over one of the opto-electronic device dies 1006. In other embodiments, each of the first, second, and third optical elements 1010a, 1010b, and 1010c may be formed over one or more of the opto-electronic device dies 1006. The first, second, and third optical elements 1010a, 1010b, and 1010c are associated with a first wavelength or a first wavelength range, a second wavelength or a second wavelength range, and a third wavelength or a third wavelength range, respectively, which may be different from each other. In the example shown in FIG. 10, the first, second, and third optical elements 1010a, 1010b, and 1010c are formed to cover all exposed surfaces of the corresponding opto-electronic device dies 1006. In other embodiments, the first, second, and third optical elements 1010a, 1010b, and 1010c can be formed, for example, to only over the upper surfaces of the corresponding opto-electronic device dies 1006.

Depending on the type of the opto-electronic device dies 1006, the first, second, and third optical elements 1010a, 1010b, and 1010c can be different types of optical elements. For example, the opto-electronic device dies 1006 are LED dies, such as GaN-based ultra-violet (UV) LED dies. In this scenario, the first, second, and third optical elements 1010a, 1010b, and 1010c can be phosphor layers containing different types of phosphors. For example, the first optical element 1010a can contain blue phosphors, the second optical element 1010b can contain green phosphors, and the third optical element 1010c can contain red phosphors. As such, UV light emitted by the LED dies can be converted into different colors. Such an opto-electronic apparatus can be used, for example, as a full-color display panel or as a white-light illumination panel.

As another example, the opto-electronic device dies 1006 are photodetector dies, such as Si-based photodetector dies or III-V material-based photodetector dies. In this scenario, the first, second, and third optical elements 1010a, 1010b, and 1010c can be filter layers that allow light of different wavelengths or different wavelength ranges to pass through. For example, the first optical element 1010a can be a filter layer that allows blue light to pass through, the second optical element 1010b can be a filter layer that allows green light to pass through, and the third optical element 1010c can be a filter layer that allows red light to pass through. Such an opto-electronic apparatus can be used, for example, as a full-color sensor used in a digital camera.

Figure 11:
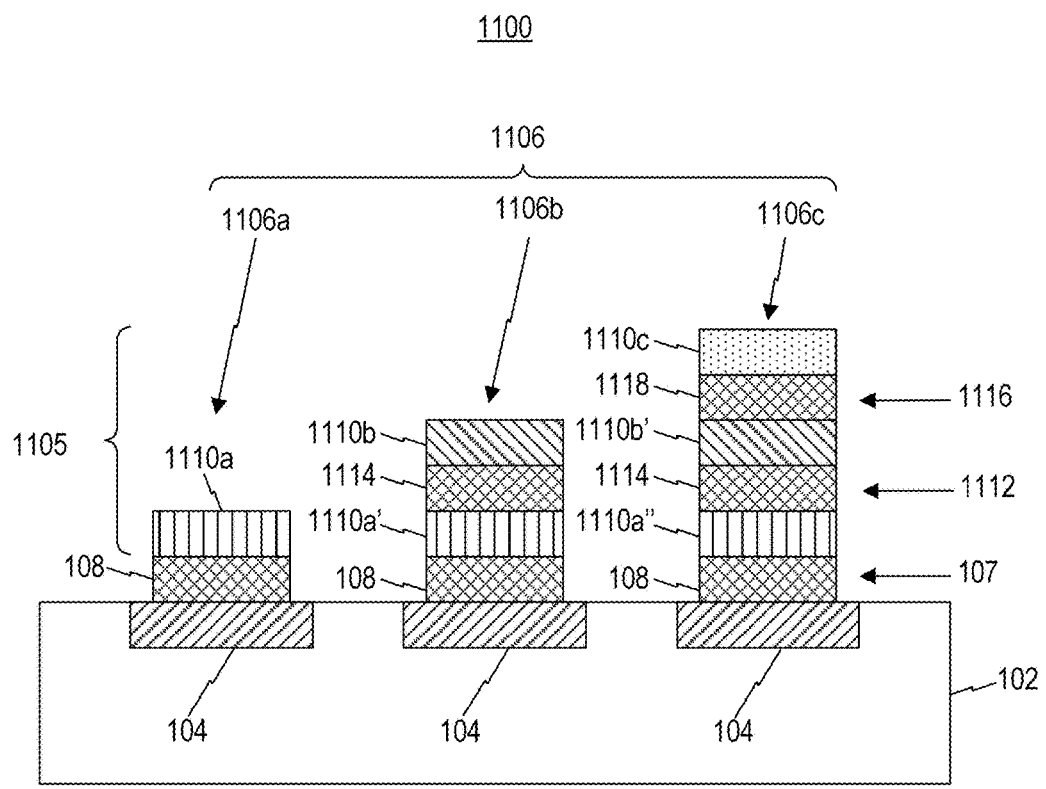
FIG. 11 schematically shows an opto-electronic apparatus according to another exemplary embodiment.

As an alternative to the examples described above, the opto-electronic device dies themselves can be configured in such a manner that they are associated with different wavelengths or different wavelength ranges. FIG. 11 is a cross-sectional view schematically showing another exemplary opto-electronic apparatus 1100 consistent with embodiments of the present disclosure. The opto-electronic apparatus 1100 includes the driver circuit wafer 102 having the driver circuits 104, the bonding metal layer 107 formed over the driver circuit wafer 102 and having the bonding metal pads 108, and an opto-electronic epi-layer 1105 formed over the bonding metal layer 107 and having a plurality of opto-electronic device dies 1106. The opto-electronic device dies 1106 include a first opto-electronic device die 1106a associated with a first wavelength or a first wavelength range, a second opto-electronic device die 1106b associated with a second wavelength or a second wavelength range, and a third opto-electronic device die 1106c associated with a third wavelength or a third wavelength range. The first, second, and third wavelengths, or the first, second, and third wavelength ranges, can be different from each other.

FIG. 11 only shows one first opto-electronic device die 1106a, one second opto-electronic device die 1106b, and one third opto-electronic device die 1106c. However, consistent with the present disclosure, the opto-electronic apparatus 1100 can have more than one first opto-electronic device die 1106a, more than one second opto-electronic device die 1106b, and/or more than one third opto-electronic device die 1106c.

In some embodiments, the opto-electronic device dies 1106a, 1106b, and 1106c are light-emitting dies such as LED dies that emit light of different wavelengths or different wavelength ranges. For example, the first, second, and third opto-electronic device dies 1106a, 1106b, and 1106c can be red, green, and blue LED dies, respectively, or be red, blue, and green LED dies, respectively, or be green, red, and blue LED dies, respectively, or be green, blue, and red LED dies, respectively, or be blue, red, and green LED dies, respectively, or be blue, green, and red LED dies, respectively. Such an opto-electronic apparatus can also be used, for example, as a full-color display panel or as a white-light illumination panel.

In some embodiments, the opto-electronic device dies 1106a, 1106b, and 1106c are light-absorbing dies such as photodetector dies that absorb light of different wavelengths or different wavelength ranges. For example, the first opto-electronic device die 1106a can be a photodetector die detecting blue light, the second opto-electronic device die 1106b can be a photodetector dies detecting green light, and the third opto-electronic device die 1106c can be a photodetector die detecting red light. Such an opto-electronic apparatus can also be used, for example, as a full-color sensor used in a digital camera.

As shown in FIG. 11, the first opto-electronic device die 1106a includes a first active layer 1110a associated with the first wavelength or the first wavelength range. The second opto-electronic device die 1106b includes a second active layer 1110b associated with the second wavelength or the second wavelength range, and formed over a first dummy layer 1110a'. The third opto-electronic device die 1106c includes a third active layer 1110c associated with the third wavelength or the third wavelength range, and formed over a second dummy layer 1110b'. The second dummy layer 1110b' is in turn formed over a third dummy layer 1110a". Consistent with the present disclosure, the first active layer 1110a, the first dummy layer 1110a', and the third dummy layer 1110a" have a similar material structure. Similarly, the second active layer 1110b and the second dummy layer 1110b' have a similar material structure.

As shown in FIG. 11, the first, second, and third opto-electronic device dies 1106a, 1106b, and 1106c are bonded to the driver circuit wafer 102 through the bonding metal pads 108 of the bonding metal layer 107. In the embodiments described here in connection with FIG. 11 and below in connection with FIGS. 12A-12K, the bonding metal layer 107 is also referred to as "first bonding metal layer 107" and the bonding metal pads 108 are also referred to as "first bonding metal pads 108." The opto-electronic apparatus 1100 further includes a second bonding metal layer 1112 having a plurality of second bonding metal pads 1114 and a third bonding metal layer 1116 having a plurality of third bonding metal pads 1118 (one of which is shown in FIG. 11). The second active layer 1110b is bonded to the first dummy layer 1110a' through one of the second bonding metal pads 1114. The second dummy layer 1110b' is bonded to the third dummy layer 1110a" through another one of the second bonding metal pads 1114. Further the third active layer 1110c is bonded to the second dummy layer 1110b' through one of the third bonding metal pads 1118.

FIGS. 12A-12K schematically show an exemplary process for manufacturing the opto-electronic apparatus 1100 consistent with embodiments of the present disclosure. In this exemplary process, the step for forming the first pre-bonding metal layer 202 over the driver circuit wafer 102 is similar to that described above in connection with FIG. 2A. Therefore, this step is not illustrated again in FIGS. 12A-12K, and the description thereof is omitted.

Figure 12A:
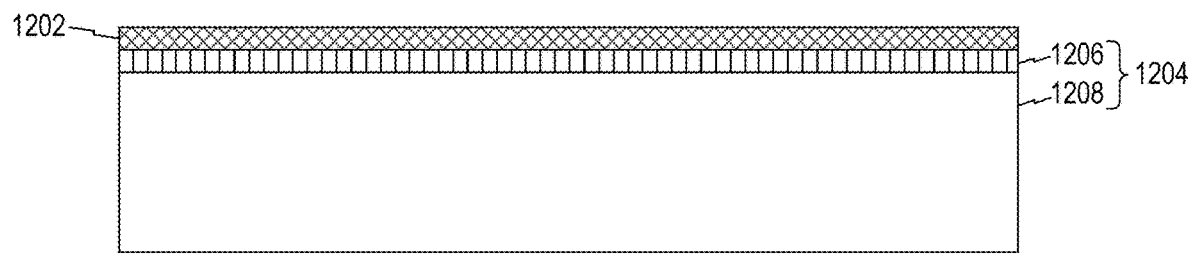
FIGS. 12A-12K schematically show a process for manufacturing the opto-electronic apparatus of FIG. 11 according to an exemplary embodiment.
Figure 12B:
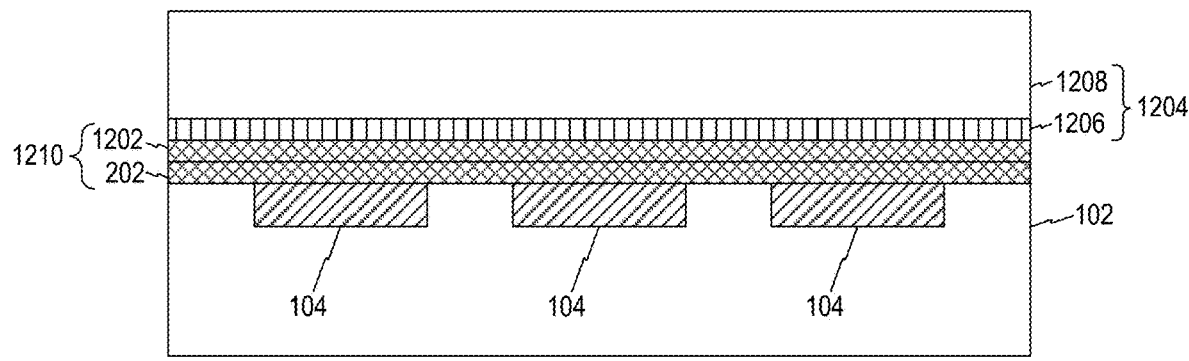
Figure 12C:
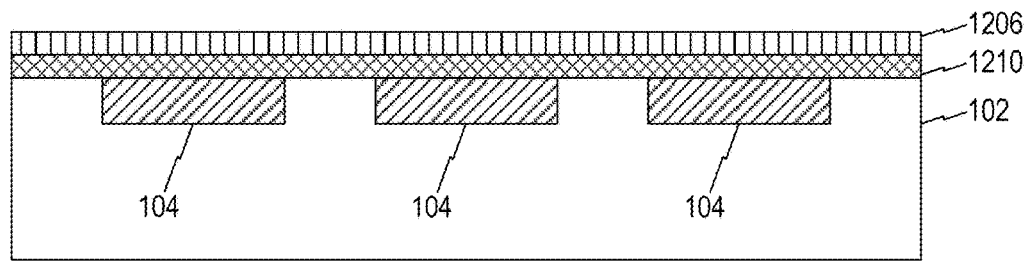

Referring to FIG. 12A, a second pre-bonding metal layer 1202 is formed over a first opto-electronic device wafer 1204. The first opto-electronic device wafer 1204 includes a first opto-electronic device epi-structure layer 1206 epitaxially grown on a first growth substrate 1208. Next, as shown in FIG. 12B, the first opto-electronic device wafer 1204 is bonded to the driver circuit wafer 102, with the second pre-bonding metal layer 1202 and the first pre-bonding metal layer 202 being bonded together to form a first unpatterned bonding metal layer 1210. Thereafter, as shown in FIG. 12C, the first growth substrate 1208 is removed to expose the first opto-electronic device epi-structure layer 1206.

Figure 12D:
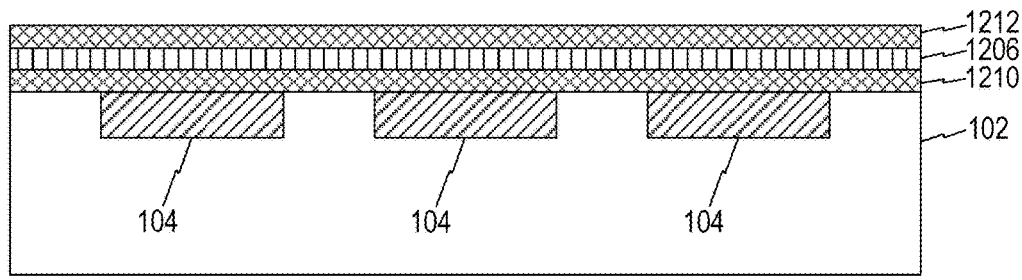
Figure 12E:
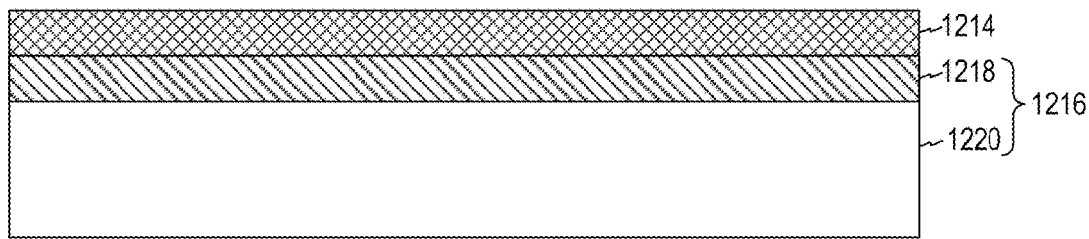
Figure 12F:
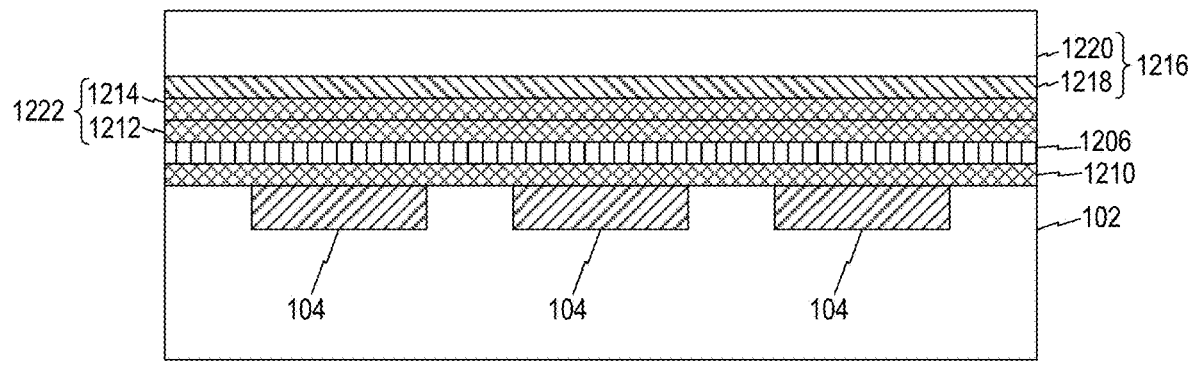
Figure 12G:
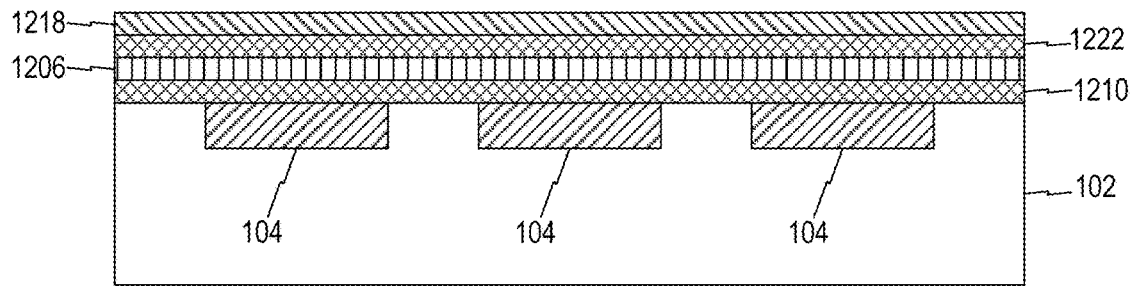

Referring to FIG. 12D, a third pre-bonding metal layer 1212 is formed over the first opto-electronic device epi-structure layer 1206. Also, as shown in FIG. 12E, a fourth pre-bonding metal layer 1214 is formed over a second opto-electronic device wafer 1216, which includes a second opto-electronic device epi-structure layer 1218 epitaxially grown on a second growth substrate 1220. Next, as shown in FIG. 12F, the second opto-electronic device wafer 1216 is bonded to the first opto-electronic device epi-structure layer 1206, with the fourth pre-bonding metal layer 1214 and the third pre-bonding metal layer 1212 being bonded together to form a second unpatterned bonding metal layer 1222. Thereafter, as shown in FIG. 12G, the second growth substrate 1220 is removed to expose the second opto-electronic device epi-structure layer 1218.

Figure 12H:
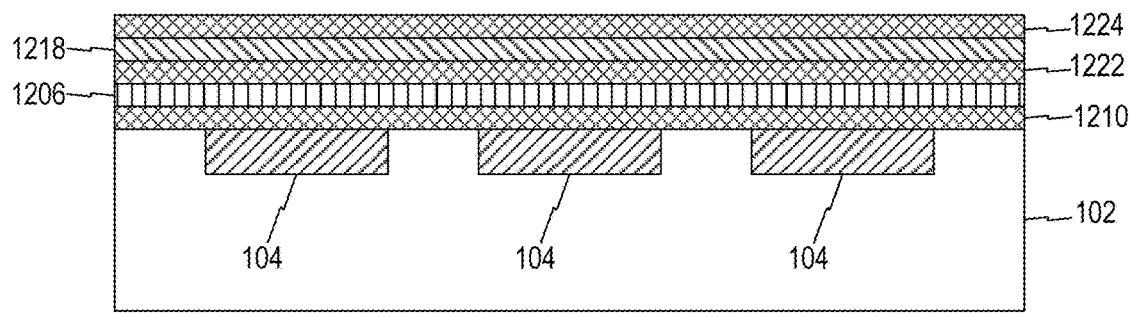
Figure 12I:
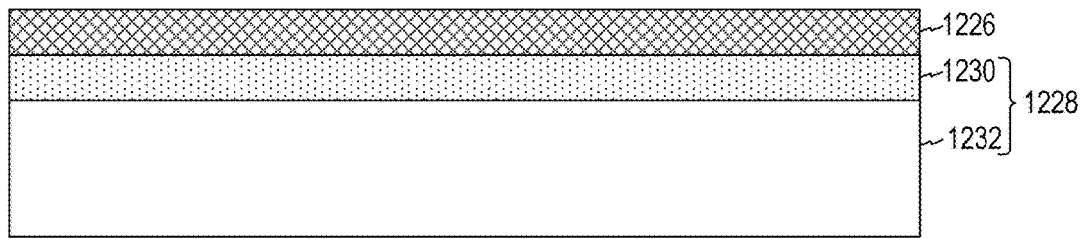
Figure 12J:
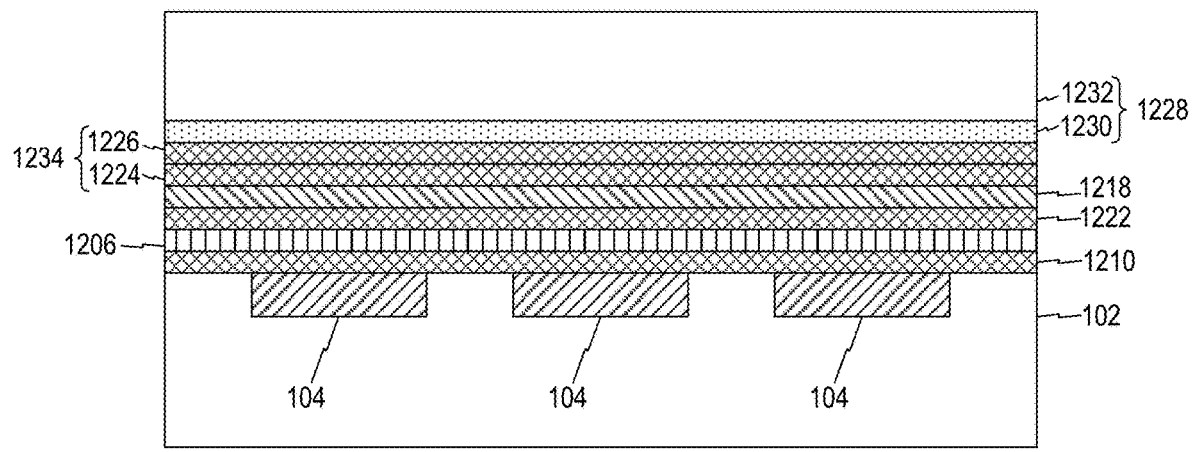
Figure 12K:
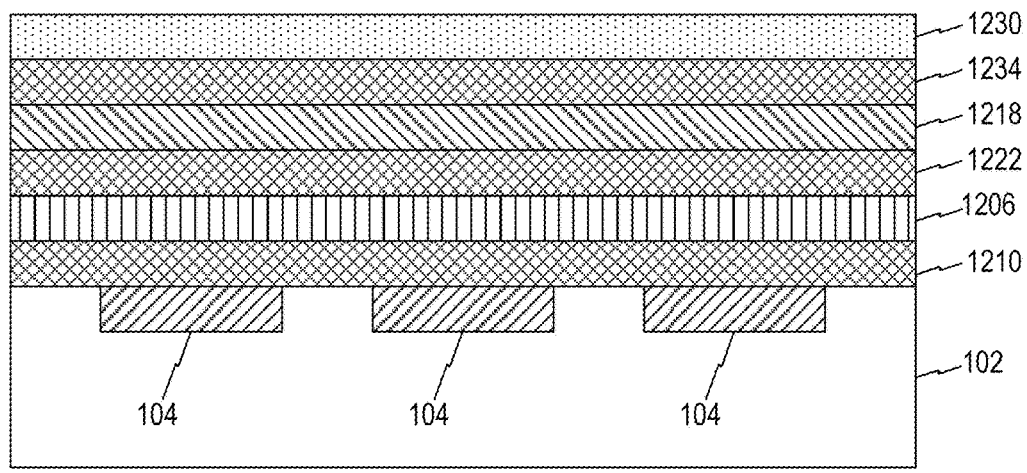

Referring to FIG. 12H, a fifth pre-bonding metal layer 1224 is formed over the second opto-electronic device epi-structure layer 1218. Also, as shown in FIG. 12I, a sixth pre-bonding metal layer 1226 is formed over a third opto-electronic device wafer 1228, which includes a third opto-electronic device epi-structure layer 1230 epitaxially grown on a third growth substrate 1232. Next, as shown in FIG. 12J, the third opto-electronic device wafer 1228 is bonded to the second opto-electronic device epi-structure layer 1218, with the sixth pre-bonding metal layer 1226 and the fifth pre-bonding metal layer 1224 being bonded together to form a third unpatterned bonding metal layer 1234. Thereafter, as shown in FIG. 12K, the third growth substrate 1232 is removed to expose the third opto-electronic device epi-structure layer 1230.

After the third growth substrate 1232 is removed, the remaining parts constitute another exemplary semiconductor apparatus 1200 consistent with embodiments of the present disclosure. That is, the semiconductor apparatus 1200 is an intermediate product formed during the process of forming the semiconductor apparatus 1100. As shown in FIG. 12, the semiconductor apparatus 1200 includes the driver circuit wafer 102 having the plurality of driver circuits 104 arranged in an array, the first unpatterned bonding metal layer 1210 formed over the driver circuit wafer 102, the first opto-electronic device epi-structure layer 1206 formed over the first unpatterned bonding metal layer 1210, the second unpatterned bonding metal layer 1222 formed over the first opto-electronic device epi-structure layer 1206, the second opto-electronic device epi-structure layer 1218 formed over the second unpatterned bonding metal layer 1222, the third unpatterned bonding metal layer 1234 formed over the second opto-electronic device epi-structure layer 1218, and the third opto-electronic device epi-structure layer 1230 formed over the third unpatterned bonding metal layer 1234. In particular, like the semiconductor apparatus 1100, the semiconductor apparatus 1200 does not include any growth substrate, and therefore the third opto-electronic device epi-structure layer 1230 is exposed to the environment. Different from the semiconductor apparatus 1100, the semiconductor apparatus 1200 has horizontally continuous first, second, and third unpatterned bonding metal layers 1210, 1222, and 1234, and horizontally continuous first, second, and third opto-electronic device epi-structure layers 1206, 1218, and 1230.

According to the present disclosure, after the first, second, and third opto-electronic device epi-structure layers 1206, 1218, and 1230 are bonded onto the driver circuit wafer 102, subsequent processes including patterning the opto-electronic device epi-structure layers 1206, 1218, and 1230, and the first, second, and third unpatterned bonding metal layers 1210, 1222, and 1234, are performed to form the opto-electronic apparatus 1110 shown in FIG. 11.

In the exemplary process described above in connection with FIGS. 12A-12K, the first, second, and third opto-electronic device epi-structure layers 1206, 1218, and 1230 are bonded to the driver circuit wafer 102 sequentially in that order. However, the process for bonding the first, second, and third opto-electronic device epi-structure layers 1206, 1218, and 1230 according to the present disclosure is not limited to that exemplary process. Two or more of the opto-electronic device epi-structure layers 1206, 1218, and 1230 can be first bonded to each other and then bonded to the driver circuit wafer 102. For example, in one exemplary process, the first opto-electronic device epi-structure layer 1206 is bonded to the driver circuit wafer 102. The second and third opto-electronic device epi-structure layers 1218 and 1230 are first bonded to each other, and then the bonded structure of the second and third opto-electronic device epi-structure layers 1218 and 1230 is bonded to the first opto-electronic device epi-structure layer 1206. In another exemplary process, the first and second opto-electronic device epi-structure layers 1206 and 1218 are first bonded to each other, and then the bonded structure of the first and second opto-electronic device epi-structure layers 1206 and 1218 is bonded to the driver circuit wafer 102. The third opto-electronic device epi-structure layer 1230 is then bonded to the second opto-electronic device epi-structure layer 1218. In a further exemplary process, the first, second, and third opto-electronic device epi-structure layers 1206, 1218, and 1230 are first bonded together, and then the bonded structure of the first, second, and third opto-electronic device epi-structure layers 1206, 1218, and 1230 is bonded to the driver circuit wafer 102.

In the exemplary process described above in connection with FIGS. 12A-12K and the exemplary semiconductor apparatus 1200 shown in FIG. 12K, the first, second, and third opto-electronic device epi-structure layers 1206, 1218, and 1230 are bonded to each other or to the driver circuit wafer 102 through an unpatterned bonding metal layer. However, similar to the exemplary process described in connection with FIGS. 3A-3D and the exemplary semiconductor apparatus 300 shown in FIG. 3D, and the exemplary process described in connection with FIGS. 4A-5B and the exemplary semiconductor apparatus 400 shown in FIG. 4B, one or more of the unpatterned bonding metal layers 1210, 1222, and 1234 can be patterned during the process of forming the semiconductor apparatus 1200. Correspondingly, in the semiconductor apparatus 1200, one or more of the unpatterned bonding metal layers 1210, 1222, and 1234 can be replaced with patterned bonding metal layers including a plurality of bonding metal pads.

FIG. 11 schematically shows an exemplary semiconductor apparatus including three different types of opto-electronic device dies associated with three different wavelengths or wavelength ranges. In some embodiments, a semiconductor apparatus according to the present disclosure can include two different types of opto-electronic device dies associated with two different wavelengths or wavelength ranges, or can include four or more different types of opto-electronic device dies associated with four or more different wavelengths or wavelength ranges. Each of the opto-electronic device dies is bonded to the driver circuit wafer 102, and includes one or more active layers. For an opto-electronic device die having multiple active layers, neighboring active layers are also bonded to each other through a bonding metal pad.

Similarly, FIG. 12K schematically shows an exemplary semiconductor apparatus including three opto-electronic device epi-structure layers associated with three different wavelengths or wavelength ranges. In some embodiments, a semiconductor apparatus according to the present disclosure can include two opto-electronic device epi-structure layers associated with two different wavelengths or wavelength ranges, or can include four or more opto-electronic device epi-structure layers associated with four or more different wavelengths or wavelength ranges. Each of the opto-electronic device epi-structure layers is either bonded to the driver circuit wafer 102 through a bonding metal layer or bonded to another opto-electronic device epi-structure layer through a bonding metal layer.

It is noted that the drawings of the present disclosure merely illustrate the schematic structures of exemplary semiconductor apparatus consistent with the present disclosure, but may not illustrate the actual shape and/or dimensions of the components of the semiconductor apparatus. For example, in the drawings described above, side walls of the functional device dies, such as the functional device dies 106 shown in FIG. 1, are shown perpendicular to the surfaces of the functional device dies 106 and the driver circuit wafer 102. However, depending on the method for patterning the functional device epi-structure layer, such as the functional device epi-structure layer 208 shown in FIG. 2B, and whether the functional device epi-structure layer is patterned before or after being bonded to the driver circuit wafer 102, the side walls of the resulting functional device dies can be tapered. The tapering can be in different directions and have different tapering angles. Also, to simplify and generalize the description, some details and components of the semiconductor apparatus are not shown in the drawings described above, such as the detailed structure of the driver circuits 104 and other auxiliary components.

Figure 13A:
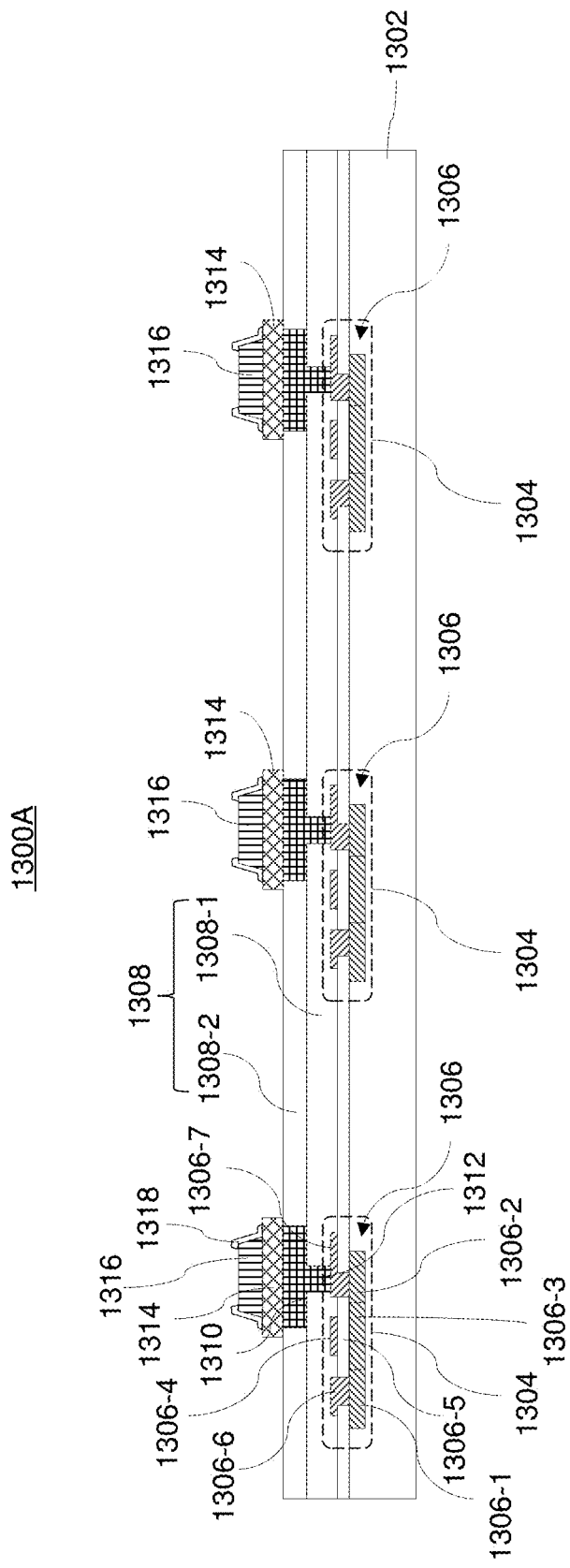
FIG. 13A schematically shows a light-emitting diode (LED) panel according to an exemplary embodiment.
Figure 13B:
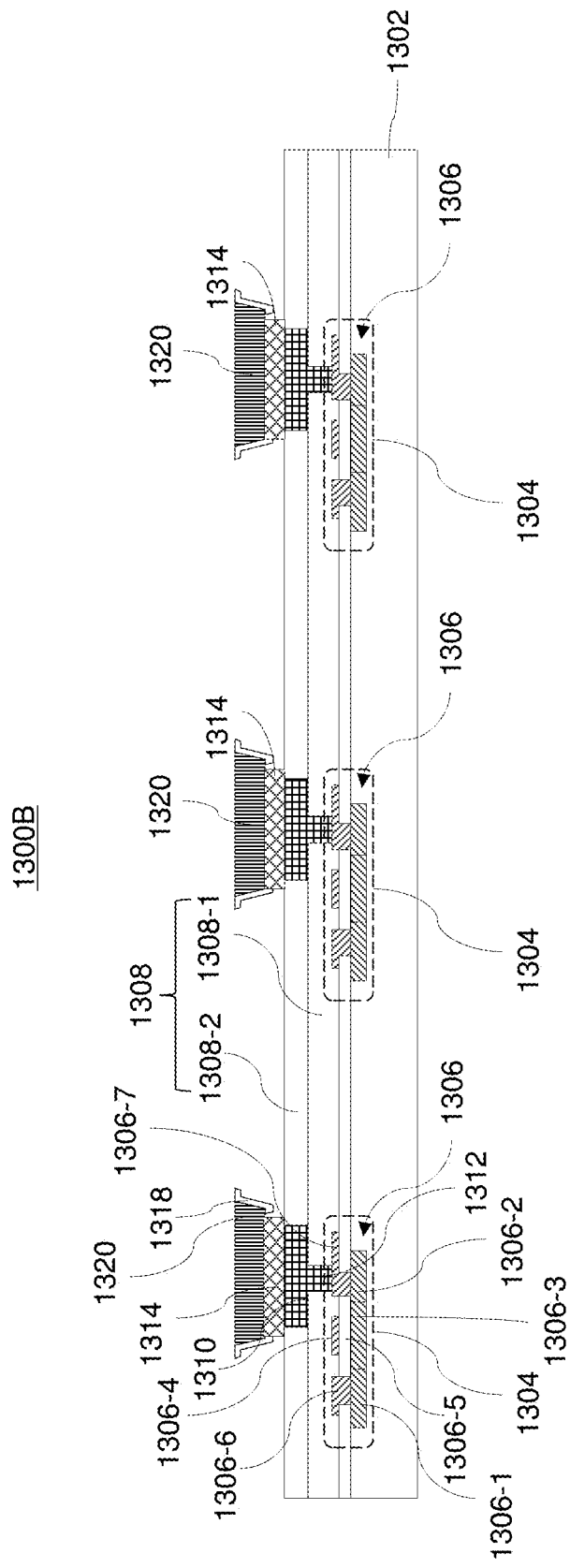
FIG. 13B schematically shows an LED panel according to another exemplary embodiment.

FIGS. 13A and 13B are cross-sectional views schematically showing exemplary LED panels 1300A and 1300B, respectively. As shown in FIG. 13A, the LED panel 1300A includes a single crystalline Si substrate 1302 and a plurality of driver circuits 1304 fabricated at least partially in the substrate 1302. Each of the driver circuits 1304 includes an MOS-based integrated circuit. Although one MOS structure 1306 for each driver circuit 1304 is shown in FIG. 13A, it is to be understood that the driver circuit 1304 can have more than one MOS structure. The MOS structure 1306 includes a first source/drain region 1306-1, a second source/drain region 1306-2, and a channel region 1306-3 formed between the first and second source/drain regions 1306-1 and 1306-2. The MOS structure 1306 further includes a gate 1306-4 and a gate dielectric layer 1306-5 formed between the gate 1306-4 and the channel region 1306-3. First and second source/drain contacts 1306-6 and 1306-7 are formed to be electrically coupled to the first and second source/drain regions 1306-1 and 1306-2, respectively, for electrically coupling the first and second source/drain regions 1306-1 and 1306-2 to other portions of the LED panel 1300A.

As shown in FIG. 13A, the LED panel 1300A further includes an interlayer insulation layer 1308 formed over the substrate 1302. In some embodiments, as shown in FIG. 13A, the interlayer insulation layer 1308 includes a first sub-layer 1308-1 and a second sub-layer 1308-2. A driver output electrode 1310 is formed in the second sub-layer 1308-2, and is electrically coupled to the second source/drain contact 1306-7 through a plug portion 1312 formed in and through the first sub-layer 1308-1.

The LED panel 1300A further includes a plurality of bonding metal pads 1314, each of which is formed over one of the driver circuits 1304. An LED die 1316 is formed over each of the bonding metal pads 1314.

As shown in FIG. 13A, side walls of the LED die 1316 are tapered in a manner such that the upper surface of the LED die 1316 is smaller than the lower surface of the LED die 1316. A sidewall passivation layer 1318 is formed on the side walls of the LED die 1316. Consistent with the present disclosure, the LED panel 1300A can be formed, for example, by the exemplary process described above in connection with FIGS. 3A-3D.

Referring to FIG. 13B, the LED panel 1300B is similar to the LED panel 1300A, except that the LED panel 1300B includes LED dies 1320 having side walls tapered in a different manner such that the upper surface of each of the LED dies 1320 is larger than the lower surface of that LED die 1320. Consistent with the present disclosure, the LED panel 1300B can be formed, for example, by the exemplary process described above in connection with FIGS. 4A-4C or the exemplary process described above in connection with FIGS. 5A and 5B.

It is noted that in the exemplary processes described above in connection with the drawings of the present disclosure, the steps are not necessarily performed in the sequence as they are arranged in the drawings, but can be in a different order. For example, the step of forming the first pre-bonding metal layer 202 shown in FIG. 2A can be performed before or after the step of forming the second pre-bonding metal layer 204 shown in FIG. 2B. As another example, the step of patterning the first pre-bonding metal layer 202 to form the first pre-bonding metal pads 302 shown in FIG. 3A can be performed before or after the step of forming the second pre-bonding metal layer 204 shown in FIG. 2B, and can also be performed before or after the step of patterning the second pre-bonding metal layer 204 to form the second pre-bonding metal pads 304 shown in FIG. 3B.

Figure 14:
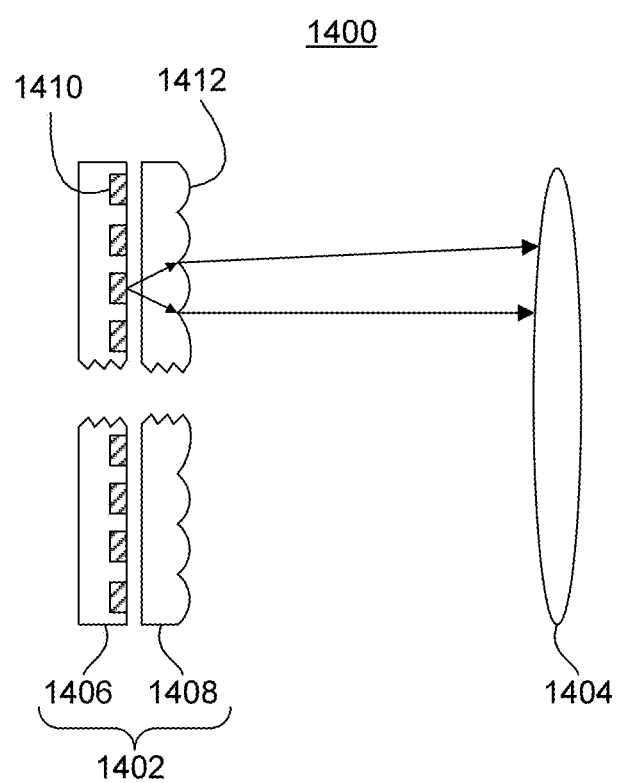
FIG. 14 schematically shows a mono-color LED projector according to an exemplary embodiment.

As discussed above, an LED panel consistent with the present disclosure can be used as an imager device in an LED projector. As an example, FIG. 14 schematically shows an exemplary mono-color LED projector 1400 consistent with the present disclosure. The LED projector 1400 includes an LED display panel 1402 and a projection lens or lens set 1404. Light emitted by the LED display panel 1402 is collected by the projection lens or lens set 1404 and projected onto, for example, a screen (not shown).

As shown in FIG. 14, the LED display panel 1402 includes an LED panel 1406 and a micro lens array 1408. The LED panel 1406 can be any LED panel consistent with the present disclosure, such as the above-described LED panel 1300A or 1300B, and includes a plurality of LED dies 1410. The micro lens array 1408 includes a plurality of micro lenses 1412. Each of the micro lenses 1412 corresponds to one LED die 1410, and is formed over the corresponding LED die 1410. Light emitted by an LED die 1410 is first converged by a corresponding micro lens 1412 and then projected onto the projection lens 1404. As a result, the divergence angle of the light emitted by the LED die 1410 is reduced by the corresponding micro lens 1412.

Figure 15:
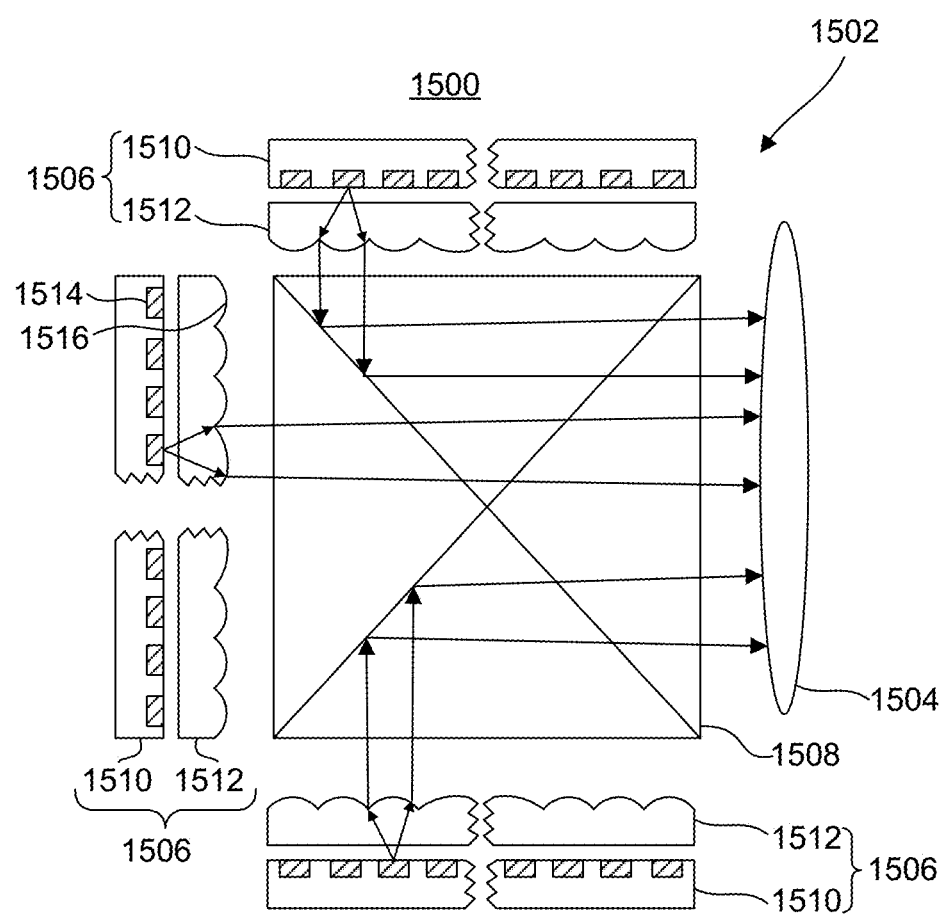
FIG. 15 schematically shows a multi-color LED projector according to an exemplary embodiment.

Similarly, FIG. 15 schematically shows an exemplary full-color LED projector 1500 consistent with the present disclosure. The LED projector 1500 includes an imaging unit 1502 and a projection lens or lens set 1504. Similar to the LED projector 1400, in the LED projector 1500, light emitted by the imaging unit 1502 is collected by the projection lens or lens set 1504 and projected onto, for example, a screen (not shown).

As shown in FIG. 15, the imaging unit 1502 includes LED display panels 1506 and a beam combiner 1508. The LED display panels 1506 emit light of different colors, which are combined in the beam combiner 1508 and then projected to the projection lens 1504. Each of the LED display panels 1506 includes an LED panel 1510 and a micro lens array 1512. Similar to the LED panel 1406, the LED panel 1510 can be any LED panel consistent with the present disclosure, such as the above-described LED panel 1300A or 1300B, and includes a plurality of LED dies 1514. Further, similar to the micro lens array 1408, the micro lens array 1512 includes a plurality of micro lenses 1516. Each of the micro lenses 1516 corresponds to one LED die 1514, and is formed over the corresponding LED die 1514. Light emitted by an LED die 1514 is first converged by a corresponding micro lens 1516 and then projected into the beam combiner 1508. As a result, the divergence angle of the light emitted by the LED die 1514 is reduced by the corresponding micro lens 1516.

Figure 16:
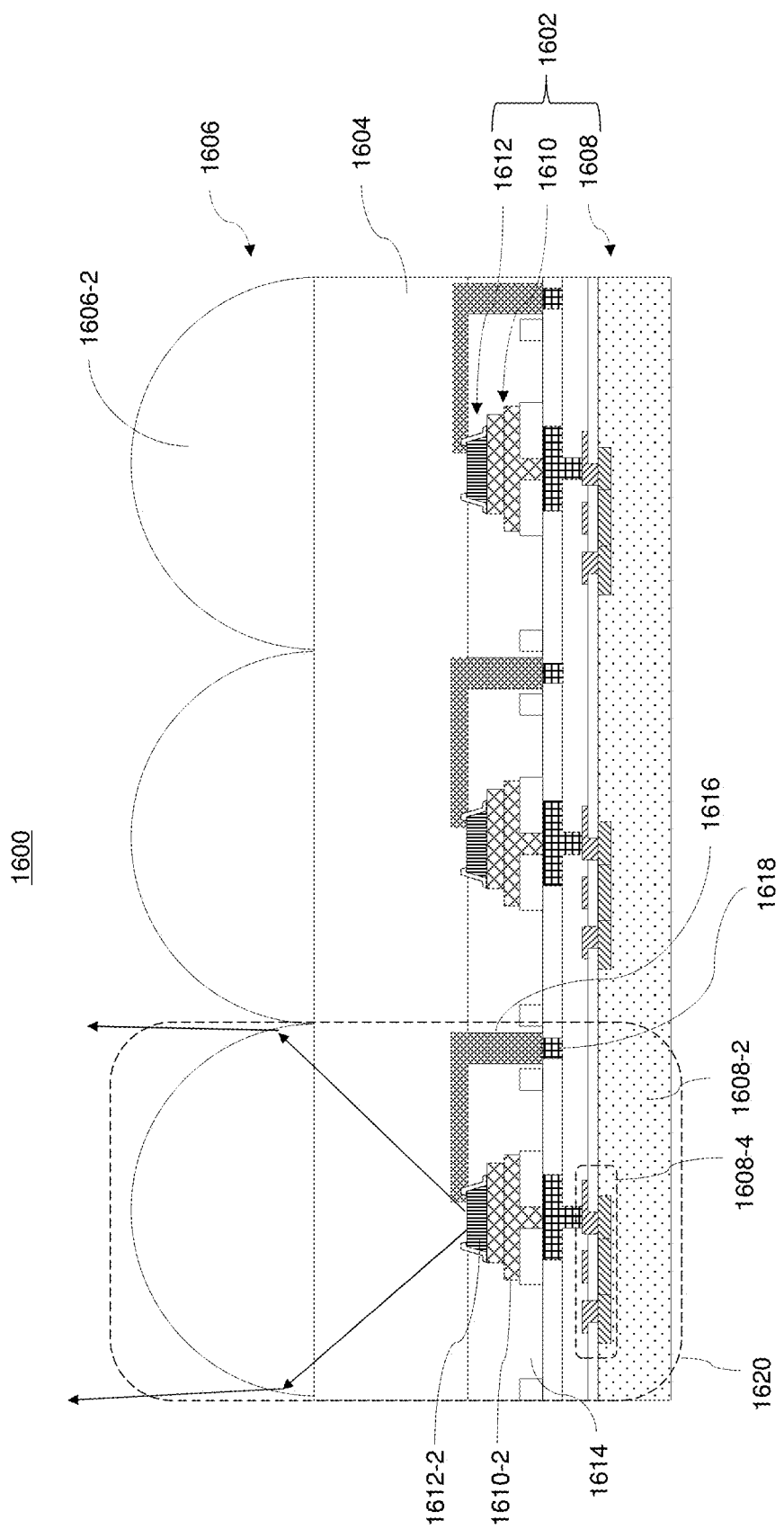
FIG. 16 schematically shows an LED display panel according to an exemplary embodiment.

FIG. 16 is a cross-sectional view schematically showing an exemplary LED display panel 1600 consistent with the present disclosure. The LED display panel 1600 includes an LED panel 1602, an optical spacer 1604 formed over the LED panel 1602, and a micro lens array 1606 formed over the optical spacer 1604.

The LED panel 1602 includes a driver circuit wafer 1608, a bonding metal layer 1610 formed over the driver circuit wafer 1608, and an LED array 1612 formed over the bonding metal layer 1610. The driver circuit wafer 1608 includes a substrate 1608-2 and a plurality of driver circuits 1608-4, also referred to as "pixel driver circuits," at least partially formed in the substrate 1608-2. The driver circuits 1608-4 form a driver circuit array. The driver circuit wafer 1608 is similar to the exemplary driver circuit wafers described above, such as the driver circuit wafer 102 described above with reference to FIG. 1, and thus its detailed description is omitted here. Further, the substrate 1608-2 and the driver circuits 1608-4 are similar to the exemplary substrates and driver circuits described above, such as the substrate 1302 and the driver circuits 1304 described above, respectively, with reference to FIGS. 13A and 13B, and thus their detailed description is omitted here.

The bonding metal layer 1610 includes a plurality of bonding metal pads 1610-2. The bonding metal pads 1610-2 are similar to the exemplary bonding metal pads described above, such as the bonding metal pads 108 described above with reference to FIG. 1, or the bonding metal pads 1314 described above with reference to FIGS. 13A and 13B, and thus their detailed description is omitted here.

The LED array 1612 includes a plurality of LED dies 1612-2 arranged in a matrix, such as a triangular matrix, a square matrix, a rectangular matrix, or a hexagonal matrix. The LED dies 1612-2 are similar to the exemplary LED dies described above, such as the LED dies 1006 described above with reference to FIG. 10, the LED dies 1106 described above with reference to FIG. 11, the LED dies 1316 described above with reference to FIG. 13A, or the LED dies 1320 described above with reference to FIG. 13B, and thus their detailed description is omitted here. Similar to the LED dies described above, each of the LED dies 1612-2 is bonded with a corresponding driver circuit 1608-4 by one corresponding bonding metal pad 1610-2. In some embodiments, the LED dies 1612-2 are identical or similar to each other and emit light of the same or similar color. In some embodiments, the LED array 1612 includes different types of LED dies, which can emit light of different colors.

In some embodiments, as shown in FIG. 16, the LED panel 1602 further includes an insulation layer 1614 formed over the driver circuit wafer 1608, the bonding metal layer 1610, and the LED array 1612. The insulation layer 1614 is also formed between the bonding metal pads 1610-2 and between the LED dies 1612-2, to provide electrical isolation between neighboring bonding metal pads 1610-2 and between neighboring LED dies 1612-2. The insulation layer 1614 is configured not to block light emitted by the LED dies 1612-2. In some embodiments, the isolation layer 1614 also provides optical isolation between neighboring LED dies 1612-2.

The LED panel 1602 also includes a plurality of metal electrodes 1616 and a common ground 1618. Each of the metal electrodes 1616 couples a corresponding LED die 1612-2 to the common ground 1618.

As shown in FIG. 16, the micro lens array 1606 includes a plurality of micro lenses 1606-2. Each of the micro lenses 1606-2 corresponds to and is formed over one of the LED dies 1612-2. Therefore, similar to the LED dies 1612-2, the micro lenses 1606-2 can also be arranged in a triangular matrix or a square matrix. The optical spacer 1604 separates the micro lens array 1606 from the LED panel 1602, and provides an optical path between each of the LED dies 1612-2 and a corresponding micro lens 1606-2.

As shown in FIG. 16, a driver circuit 1608-4, a bonding metal pad 1610-2 over the driver circuit 1608-4, an LED die 1612-2 over the bonding metal pad 1610-2, and a micro lens 1602-2 over the LED die 1612-2 form a pixel 1620 of the LED display panel 1600. Consistent with the present disclosure, one pixel 1620 only includes one driver circuit 1608-4, one bonding metal pad 1610-2, one LED die 1612-2, and one micro lens 1606-2. That is, the driver circuits 1608-4, the bonding metal pads 1610-2, the LED dies 1612-2, and the micro lens 1606-2 have a one-to-one corresponding relationship with respect to each other.

As shown in FIG. 16, the light emitted by the LED die 1612-2 (light from one LED die 1612-2 is illustrated in FIG. 16) is more converged after passing through the corresponding micro lens 1606-2. That is, the divergence angle of the light emitted by the LED die 1612-2 is reduced. For example, the divergence angle of the light exiting the micro lenses 1606-2 can be reduced to about 40° from a divergence angle of about 110° when emitted by the LED dies 1612-2.

In some embodiments, the thickness of the optical spacer 1604, and hence the distance between the LED dies 1612-2 and the micro lenses 1606-2, can be varied to achieve different divergence angle reduction results. Further, the distance between the LED dies 1612-2 and the micro lenses 1606-2 also affects how much light can be collected by each micro lens 1606-2 and how much the divergence angle can be reduced. With a smaller distance between the LED dies 1612-2 and the micro lenses 1606-2, more light from the LED dies 1612-2 may be collected by corresponding micro lenses 1606-2, but the light is less converged. On the other hand, when the distance between the LED dies 1612-2 and the micro lenses 1606-2 is larger, less light may be collected by corresponding micro lenses 1606-2 but the collected light is more converged, i.e., the light exiting the micro lenses 1606-2 has a smaller divergence angle. In some embodiments, the optical thickness of the optical spacer 1604, i.e., the product of the actual geometrical thickness of the optical spacer 1604 and the refractive index of the optical spacer 1604, can be chosen to be about 0 times to about twice the focal length of the micro lenses 1606-2.

In FIG. 16, for illustrative purposes, the optical spacer 1604 and the micro lens array 1606 are assumed to be made of the same material, or be made of materials having the same or similar refractive index, and thus no refraction occurs at the boundary between the optical spacer 1604 and the micro lens array 1606. In some embodiments, the optical spacer 1604 and the micro lens array 1606 can be made of different materials having different refractive indices. In such embodiments, refraction can occur at the boundary between the optical spacer 1604 and the micro lens array 1606. For example, the micro lens array 1606 can be made of a material having a refractive index larger than that of the material of the optical spacer 1604. In this scenario, the light emitted by the LED dies 1612-2 can be further converged.

Consistent with the present disclosure, the optical spacer 1604 can be made of, for example, glass, semiconductor, or air. The micro lens array 1606 can be made of, for example, glass or semiconductor. In some embodiments, the optical spacer 1604 and the micro lens array 1606 are made from a same piece of material. That is, an original piece of material is processed such that a portion of the piece of material forms the optical spacer 1604 and another portion of the piece of material forms the micro lens array 1606. In FIG. 16 and other figures to be described below, a line is drawn between the optical spacer 1604 and the micro lens array 1606. This line is merely for illustrative purposes to show the boundary between the optical spacer 1604 and the micro lens array 1606, but does not necessarily indicate an actual physical interface between the optical spacer 1604 and the micro lens array 1606. Depending on the materials and manufacturing processes for the optical spacer 1604 and the micro lens array 1606, there may or may not be an actual physical interface between the optical spacer 1604 and the micro lens array 1606. The optical spacer 1604 and the micro lens array 1606 can be made of materials that are optically transparent or semi-transparent to the light emitted by the LED dies 1612-2, such as polymers, dielectrics, and semiconductors. In some embodiments, the optical spacer 1604 can include an air gap. Consistent with the present disclosure, the materials for the optical spacer 1604 and the micro lens array 1606 can also be varied to achieve different divergence angle reduction results.

The shape of the micro lenses 1606-2 can be chosen to achieve different divergence angle reduction results. For example, the micro lenses 1606-2 can be spherical lenses, aspherical lenses, or Fresnel lenses. The bottom of each micro lens 1606-2 can have, for example, a circular shape, a square shape, a rectangular shape, a triangular shape, or a hexagonal shape.

Further, the size of a micro lens 1606-2 as relative to the size of the corresponding LED die 1612-2 can be adjusted to achieve different divergence angle reduction results. Consistent with the present disclosure, the lateral size, such as the diameter, of the micro lens 1606-2 is larger than the lateral size of the corresponding LED die 1612-2. Here, "lateral" refers to the horizontal direction as seen in the drawings and the lateral size of the bottom of the micro lens 1606-2 is used as the lateral size of the micro lens 1606-2. In some embodiments, the lateral size of the micro lens 1606-2 equals or is larger than about twice of the lateral size of the corresponding LED die 1606-2.

Moreover, the material and the shape of the micro lenses 1606-2 can also affect the numerical aperture of the micro lenses 1606-2, and thus affect the capability of the micro lenses 1606-2 to reduce the divergence angle. A micro lens 1606-2 having a larger curvature and/or a higher refractive index can better reduce the divergence angle.

Figure 17A:
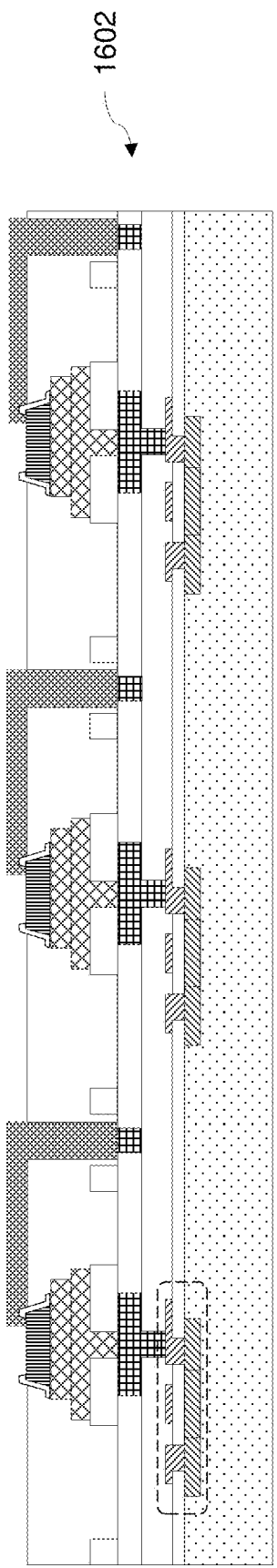
FIGS. 17A-17D schematically show a process for manufacturing the LED display panel shown in FIG. 16 according to an exemplary embodiment.

FIGS. 17A-17D show an exemplary process for manufacturing the LED display panel 1600 consistent with the present disclosure. As shown in FIG. 17A, the LED panel 1602 is provided. The LED panel 1602 can be manufactured using a suitable method consistent with the present disclosure, such as one of the exemplary methods described above. For example, the LED panel 1602 can be manufactured using the process described above with reference to FIGS. 2A-2E.

Figure 17B:
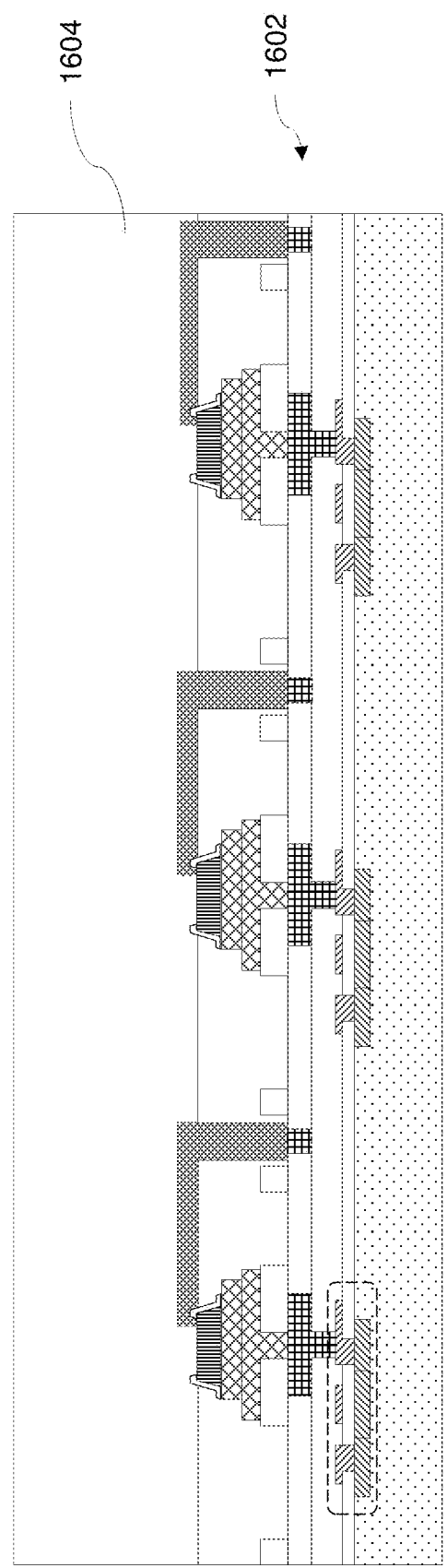

As shown in FIG. 17B, the optical spacer 1604 is formed over the LED panel 1602. In some embodiments, the optical spacer 1604 can be formed by applying a transparent material over the LED panel 1602. The transparent material can be, for example, a polymer material, a dielectric material, such as silicon oxide, or a semiconductor material, such as gallium nitride. The transparent material can be applied by, for example, a chemical-vapor deposition process, a physical-vapor deposition process, or a spin-on process. In some embodiments, the as-deposited transparent material can be flattened by, for example, polishing. In some embodiments, instead of applying a transparent material over the LED panel 1602, which is then processed to form the optical spacer 1604, the optical spacer 1604 can be pre-formed separately and then bonded onto the LED panel 1602.

Figure 17C:
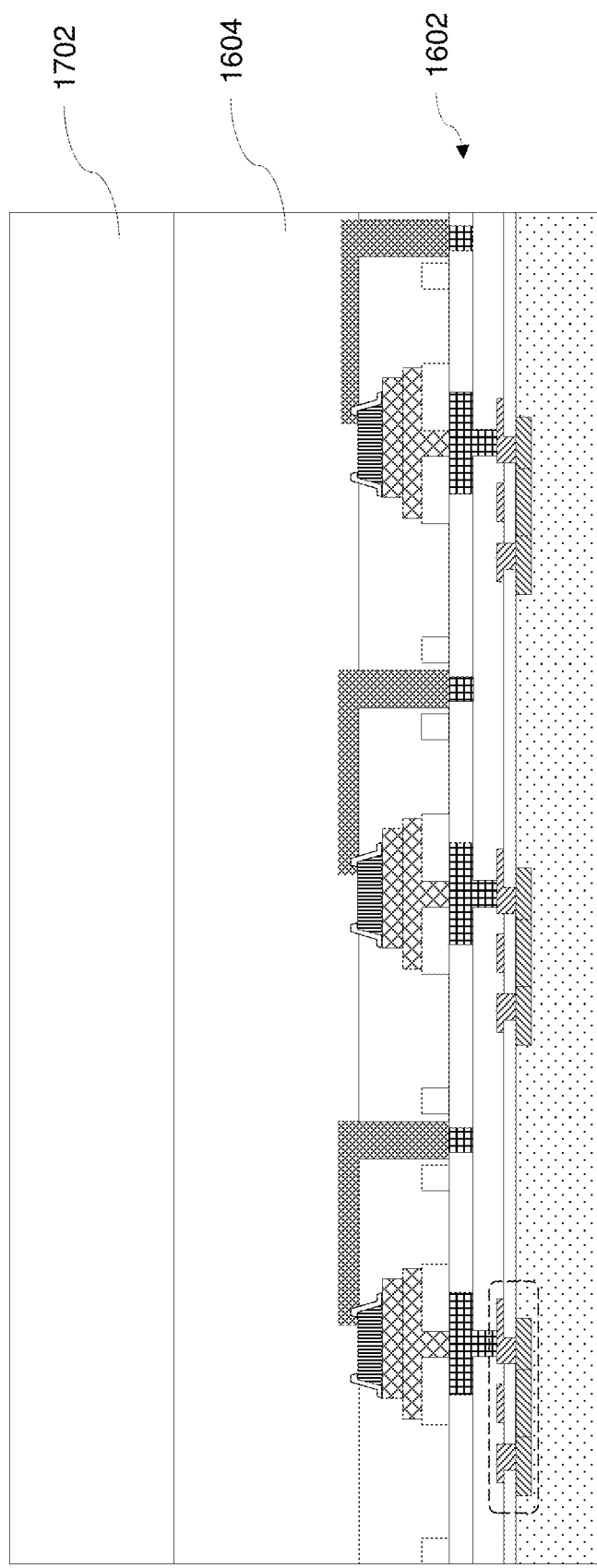
Figure 17D:
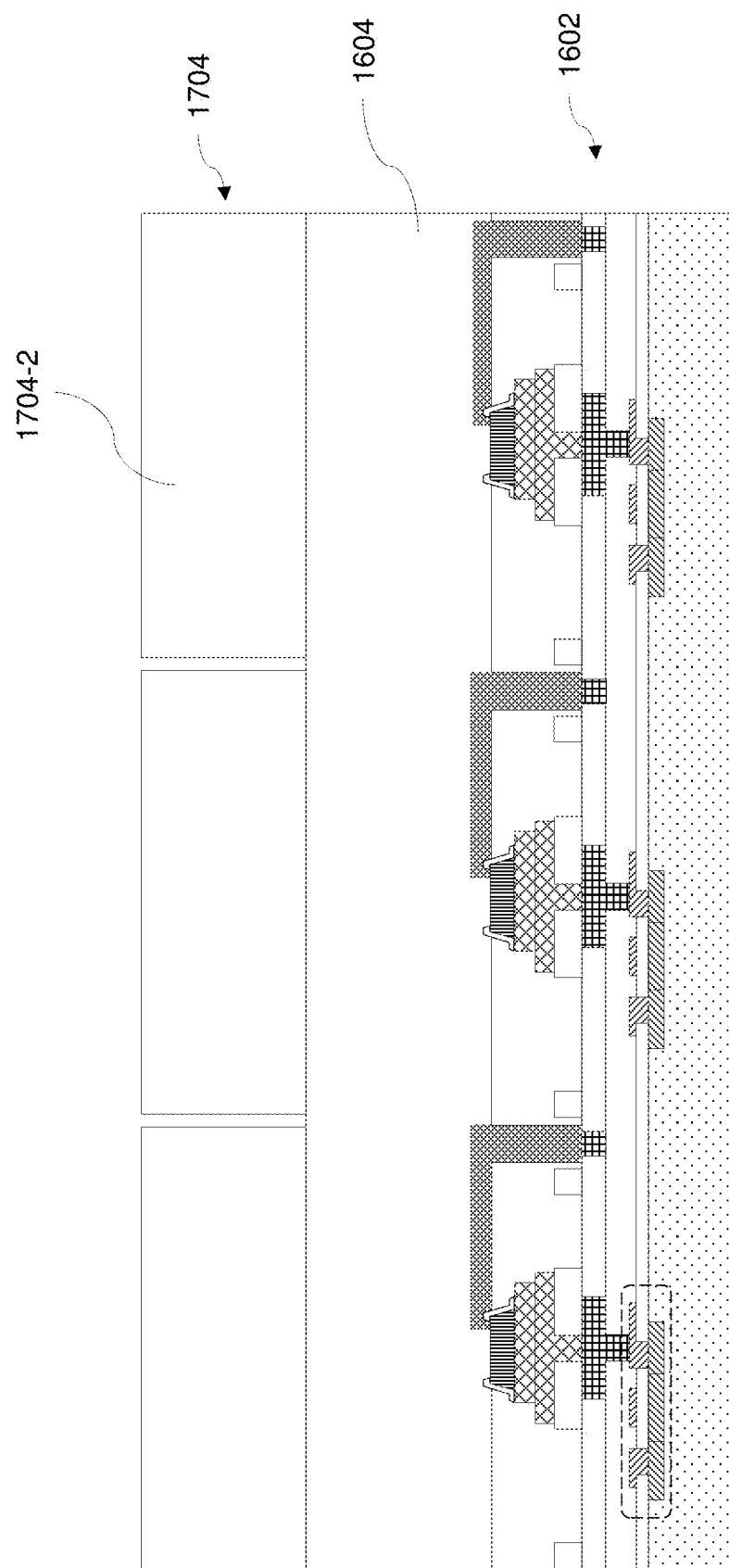

Referring to FIG. 17C, after the optical spacer 1604 is formed, a polymer layer 1702 is formed over the optical spacer 1604 by, for example, a spin-on process. Then, as shown in FIG. 17D, the polymer layer 1702 is patterned using, for example, a photolithography process, to form a patterned polymer layer 1704. The patterned polymer layer 1704 includes a plurality of polymer units 1704-2 arranged in an array, each of which corresponds to and is formed over one of the LED dies 1612-2. In some embodiments, the lateral size of the polymer units 1704-2 can be controlled to control the lateral size of the micro lenses 1606-2. In some embodiments, the thickness of the patterned polymer layer 1704 can be controlled to control the shape, for example, the curvature of the micro lenses 1606-2.

In some embodiments, the polymer layer 1702 can be made of photo-sensitive polymer, such that the polymer layer 1702 can be patterned by directly performing a photolithography process on the polymer layer 1702. In some embodiments, the polymer layer 1702 is made of non-photo-sensitive polymer. In such embodiments, a photoresist layer (not shown) can be formed over the polymer layer 1702, which is patterned to a desired shape with a desired size. The polymer layer 1702 is then etched using the patterned photoresist layer as a mask to form the patterned polymer layer 1704.

After the polymer layer 1702 is patterned, a high-temperature reflow process is performed to convert the polymer units 1704-2 into the micro lens 1606-2, forming the LED display panel 1600 shown in FIG. 16. The reflow process can be performed at a temperature above the melting point or the glass transition point of the polymer. The temperature and time period of the reflow process can be controlled to control the size and/or shape of the micro lenses 1606-2. For example, the reflow process can be performed at a temperature of about 180° C. for a period of about 10 minutes.

Figure 18:
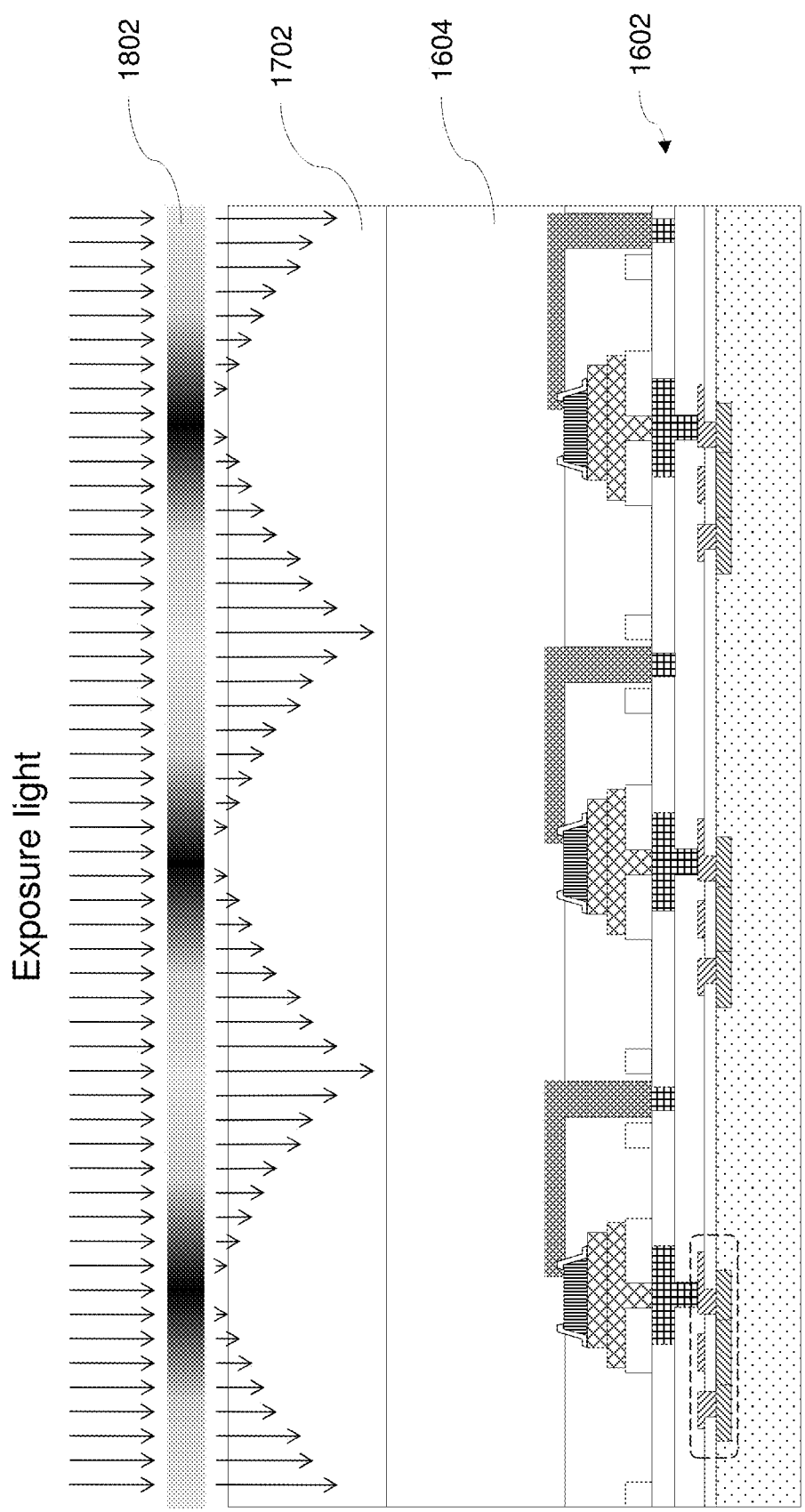
FIG. 18 schematically shows a process for manufacturing the LED display panel of FIG. 16 according to another exemplary embodiment.
Figure 19:
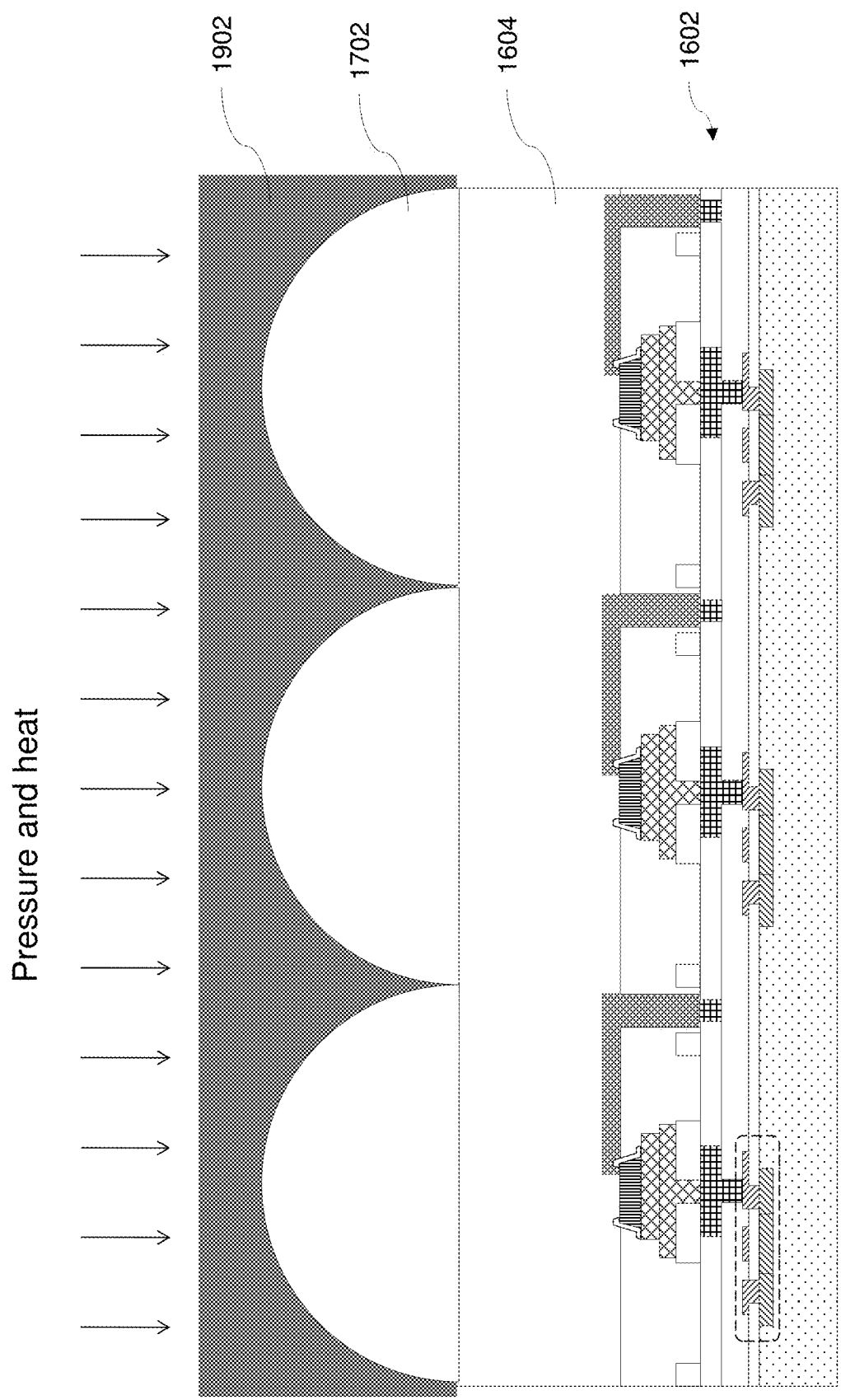
FIG. 19 schematically shows a process for manufacturing the LED display panel of FIG. 16 according to another exemplary embodiment.
Figure 20:
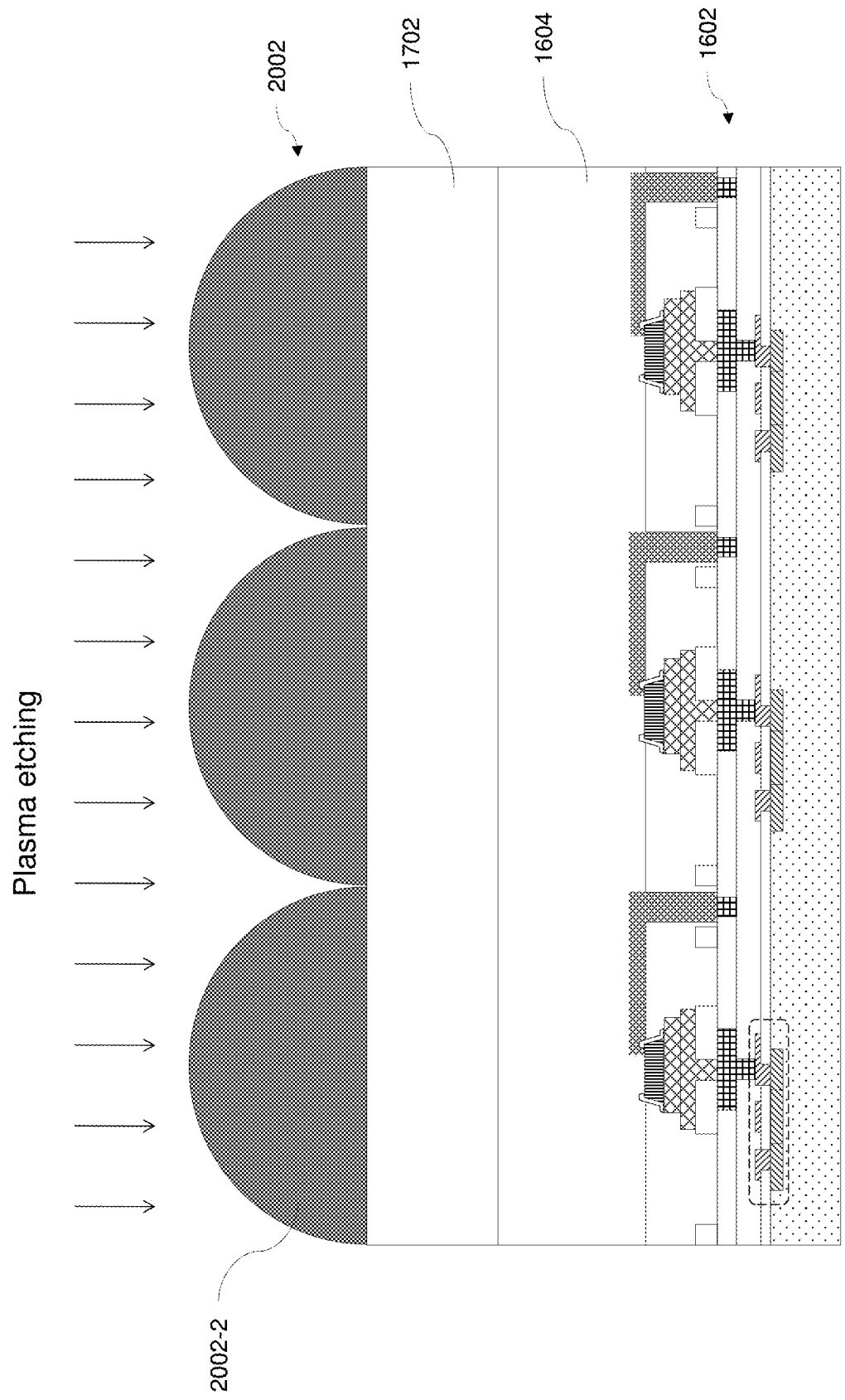
FIG. 20 schematically shows a process for manufacturing the LED display panel of FIG. 16 according to another exemplary embodiment.

Other processes can also be used to form the micro lenses 1606-2 out of the polymer layer 1702. FIGS. 18, 19, and 20 show other exemplary processes for manufacturing the LED display panel 1600 consistent with the present disclosure. In these exemplary processes, the steps of forming the LED panel 1602, the optical spacer 1604, and the polymer layer 1702 are similar to those described above with reference to FIGS. 17A-17C. Therefore, these steps are not illustrated again and their description is omitted here.

In the exemplary process shown in FIG. 18, the polymer layer 1702 is made of photo-sensitive polymer and is directly exposed using a grayscale mask 1802. The grayscale mask 1802 has a grayscale pattern corresponding to the micro lenses 1606-2 to be formed. As shown in FIG. 18, due to the grayscale pattern, different regions of the polymer layer 1702 receives different amounts of exposure. Therefore, during the subsequent developing process, different amounts of polymer material are removed from different regions of the polymer layer 1702, forming the micro lenses 1606-2 having curved surfaces, as shown in FIG. 16. In the process shown in FIG. 18, the exposure dose and time period, as well as the pattern in the grayscale mask 1802, can be controlled to control the size and shape of the micro lenses 1606-2.

In the exemplary process shown in FIG. 19, the polymer layer 1702 can be made of non-photo-sensitive polymer. In this process, a pre-fabricated mold/imprinting stamp 1902 is pressed into the polymer layer 1702 to convert at least a portion of the polymer layer 1702 into the micro lenses 1606-2. In some embodiments, during the imprinting process shown in FIG. 19, the polymer layer 1702 can be heated to soften or melt the polymer layer 1702. The pre-fabricated mold/imprinting stamp 1902 can be designed as desired so that the as-formed micro lenses 1606-2 can have the desired shape and size.

In the exemplary process shown in FIG. 20, the polymer layer 1702 can be made of non-photo-sensitive polymer. As shown in FIG. 20, a patterned photoresist layer 2002 is formed over the polymer layer 1702. The patterned photoresist layer 2002 includes a plurality of dummy units 2002-2 each having a size and a shape mimicking those of the corresponding micro lens 1606-2 to be formed. In some embodiments, the patterned photoresist layer 2002 is formed by applying a photoresist layer over the polymer layer 1702, patterning the photoresist layer to form photoresist units, and conducting a high-temperature reflow process to transform the photoresist units to the dummy units 2002-2. In some embodiments, the photoresist layer can be directly subject to a photolithography process using a grayscale mask, such as the grayscale mask 1802 shown in FIG. 18, to form the patterned photoresist layer 2002.

As shown in FIG. 20, a plasma or ion etching is performed on the patterned photoresist layer 2002 and the polymer layer 1702. Since different regions in the patterned photoresist layer 2002 have different thicknesses, different amounts of polymer material are etched from corresponding regions of the polymer layer 1702. As a result, the shape and size of the dummy units 2002-2 is "transferred" to the polymer layer 1702, forming the micro lenses 1606-2.

When the process of FIG. 20 is employed, the layer being etched to form the micro lenses 1606-2 does not need to be made of polymer. Thus, instead of the polymer layer 1702, another processing layer made of, for example, a dielectric material or a semiconductor material, can be formed over the optical layer 1604 and be processed to form the micro lenses 1606-2.

In the exemplary processes described above with reference to FIGS. 19 and 20, the optical layer 1604 and the polymer layer 1702 are formed separately. Alternatively, in some embodiments, a processing layer can be formed over the LED panel 1602 instead of separate optical layer 1604 and polymer layer 1702. An upper portion of the processing layer can be processed using a process similar to one of the exemplary processes described above with reference to FIGS. 19 and 20, to form the micro lens array 1606. The remaining lower portion of the processing layer functions as the optical layer 1604. When the process of FIG. 19 is employed, the processing layer can be entirely made of polymer. When the process of FIG. 20 is employed, the processing layer can be entirely made of polymer, dielectric, or semiconductor.

Figure 21:
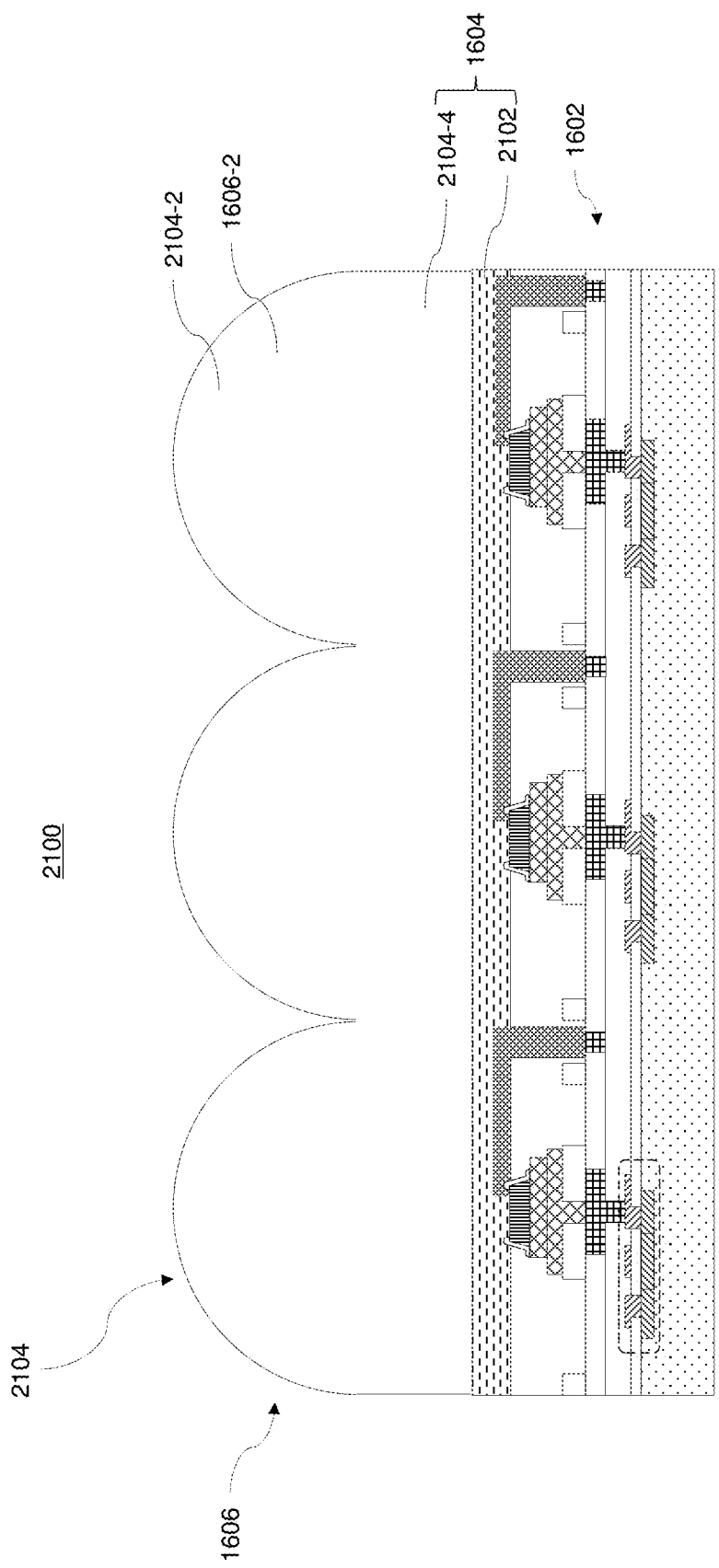
FIG. 21 schematically shows an LED display panel according to another exemplary embodiment.

FIG. 21 is a cross-sectional view schematically showing another exemplary LED display panel 2100 consistent with the present disclosure. The LED display panel 2100 includes the LED panel 1602, a bonding polymer layer 2102 formed over the LED panel 1602, and a pre-fabricated micro lens assembly 2104 bonded to the LED panel 1602 through the bonding polymer layer 2102. As shown in FIG. 21, a portion of the micro lens assembly 2104 is pre-fabricated to a plurality of curved protrusions 2104-2. The plurality of curved protrusions 2104-2 constitute the micro lenses 1606-2 and form the micro lens array 1606. The remaining part of the micro lens assembly 2104, also referred to herein as a "base portion 2104-4," and the bonding polymer layer 2102 together constitute the optical spacer 1604. The micro lens assembly 2104 can be fabricated using, for example, one of the above-described processes for forming micro lenses.

Figure 22A:
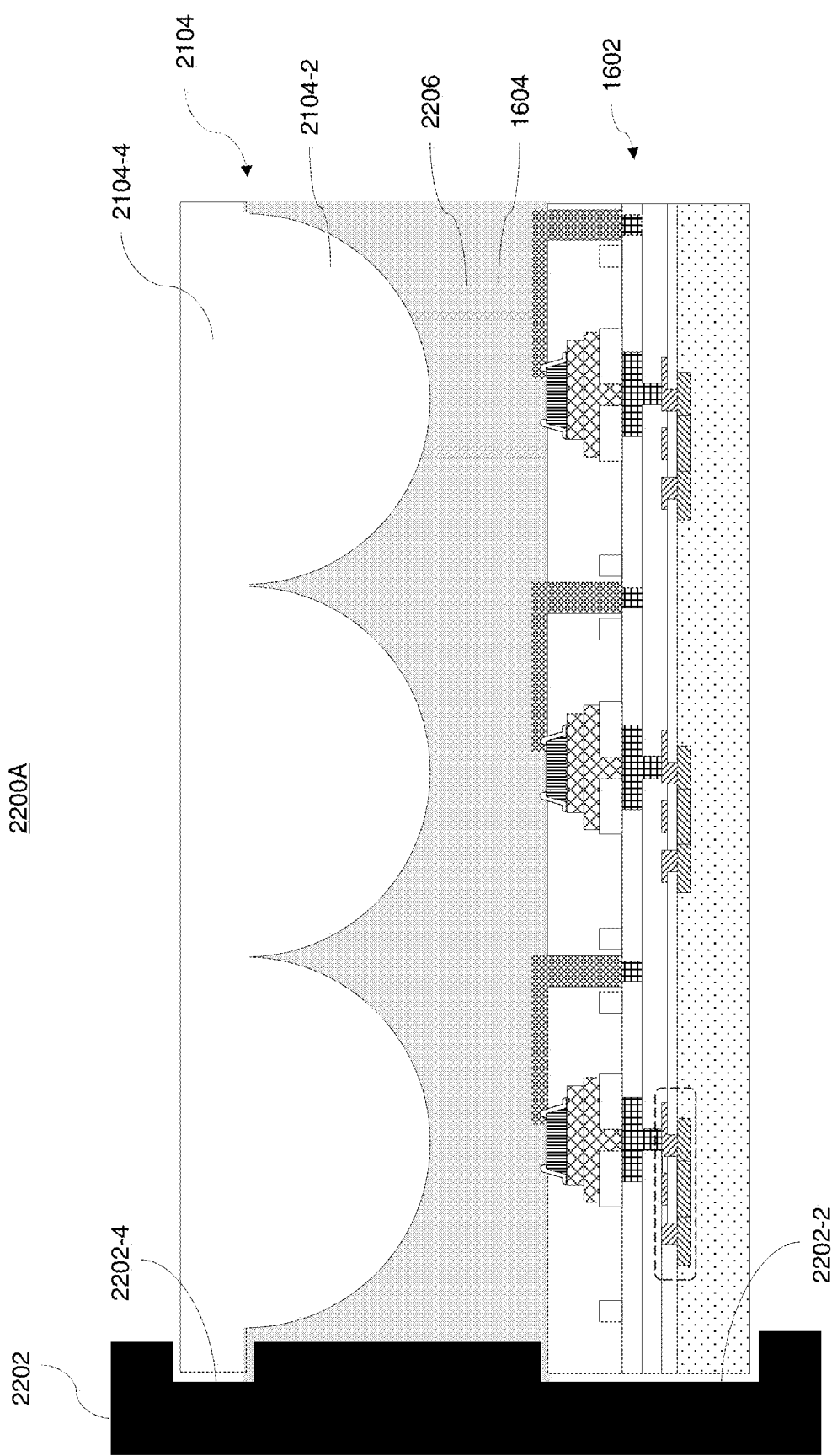
FIGS. 22A and 22B schematically show LED display panels according to other exemplary embodiments.
Figure 22B:
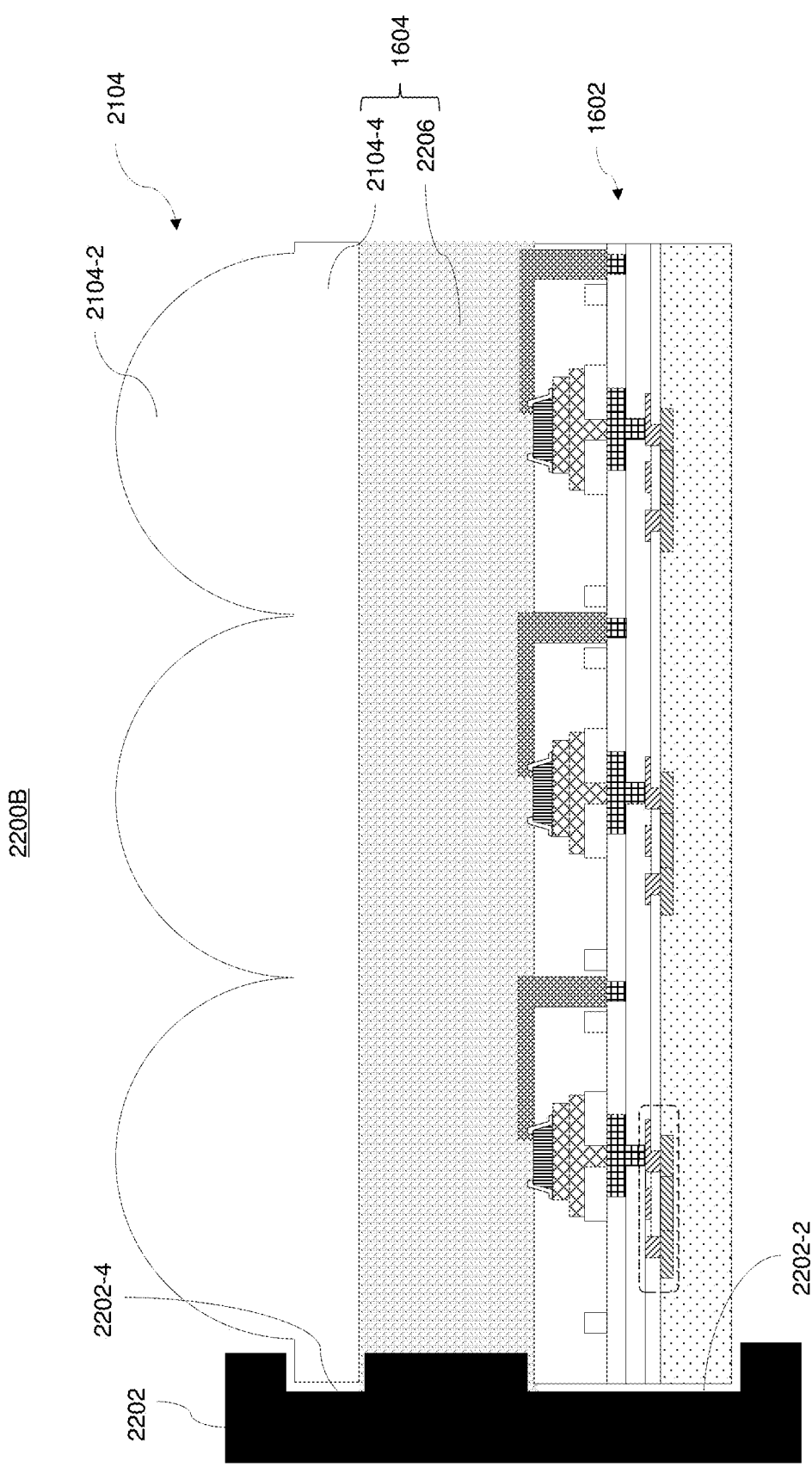

In the LED display panel 2100, the micro lens assembly 2104 is bonded to the LED panel 1602 through the bonding polymer layer 2102. In some embodiments, the micro lens assembly 2104 and the LED panel 1602 can be assembled together by other means. FIGS. 22A and 22B are cross-sectional views schematically showing other exemplary LED display panels 2200A and 2200B consistent with the present disclosure. The LED display panels 2200A and 2200B include the LED panel 1602, the micro lens assembly 2104, and a mechanical fixture 2202 holding the LED panel 1602 and the micro lens assembly 2104. In particular, the mechanical fixture 2202 includes a first clamping mechanism 2202-2 and a second clamping mechanism 2202-4. The first clamping mechanism is configured to receive a portion of the LED panel 1602 so as to hold the LED panel 1602. The second clamping mechanism 2202-4 is configured to receive a portion of the micro lens assembly 2104, such as a portion of the base portion 2104-4, so as to hold the micro lens assembly 2104. The first and second clamping mechanisms 2202-2 and 2202-4 can be, for example, recesses in the mechanical fixture 2202.

In the LED display panel 2200A, the protrusions 2104-2 of the micro lens assembly 2104 face the LED panel 1602. An air gap 2206 between the micro lens assembly 2104 and the LED panel 1602 constitutes the optical spacer 1604. In this case, since the flat base portion 2104-4 faces outwards, the protrusions 2104-2, i.e., the micro lenses 1606-2, can be protected from damage by external forces. On the other hand, in the LED display panel 2200B, the protrusions 2104-2 of the micro lens assembly 2104 face towards an opposite direction, i.e., the direction facing away from the LED panel 1602. In this case, the air gap 2206 and the base portion 2104-2 together constitute the optical spacer 1604.

In the exemplary LED display panels described above, the optical spacer and the micro lens array are made separately from the LED panel 1602. Sometimes, LED dies in an LED panel can also be manufactured using flip-chip technology. That is, semiconductor epitaxial layers are first epitaxially grown on a growth substrate and fabricated to form LED dies. The resulting epitaxial wafer including the growth substrate and the LED dies is flipped over and bonded to a driver circuit wafer through bonding pads. Usually, the growth substrate is then thinned by, for example, a polishing process. Consistent with the present disclosure, a portion of the growth substrate can be fabricated into micro lenses, such that no extra layers need to be formed.

Figure 23:
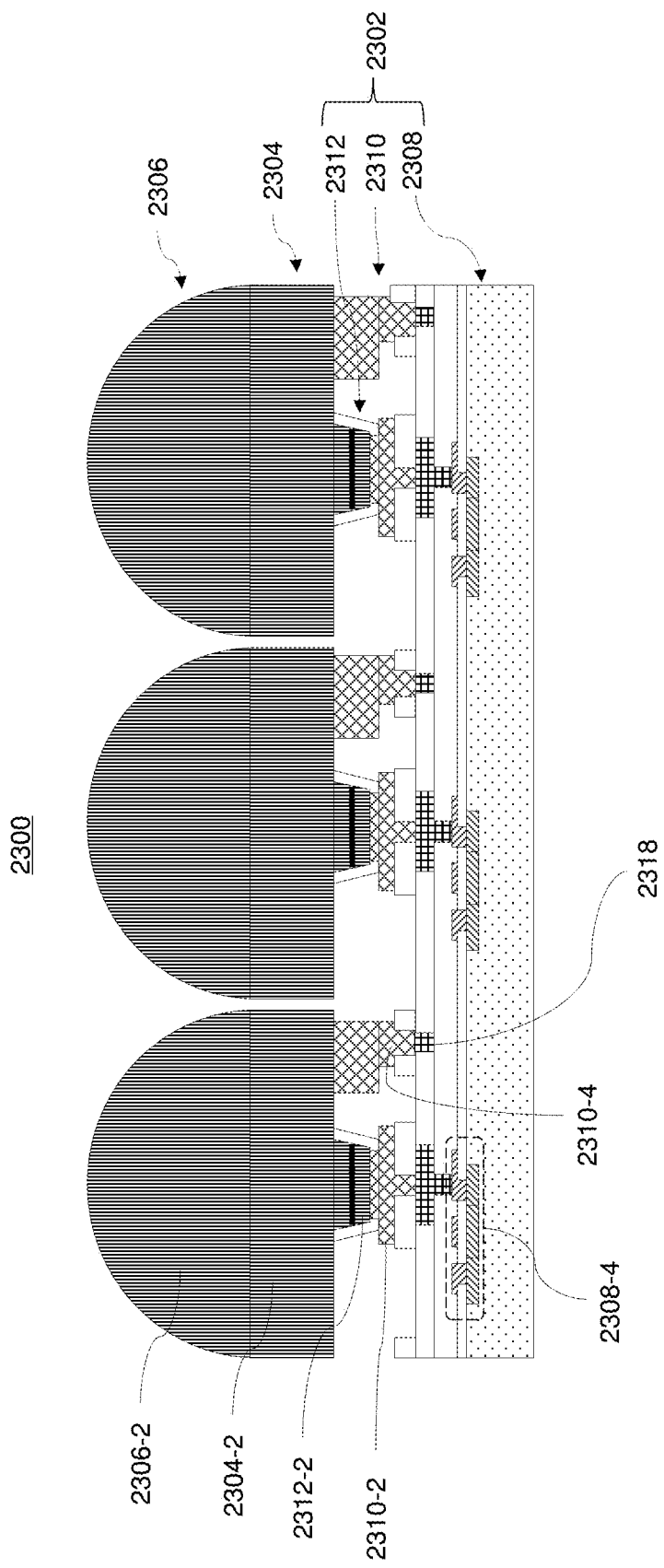
FIG. 23 schematically shows an LED display panel according to another exemplary embodiment.

FIG. 23 is a cross-sectional view schematically showing another exemplary LED display panel 2300 consistent with the present disclosure. In the LED display panel 2300, the LED dies, the optical spacer, and the micro lenses are formed from the same semiconductor epitaxial wafer.

As shown in FIG. 23, the LED display panel 2300 includes an LED panel 2302, an optical spacer 2304 over the LED panel 2302, and a micro lens array 2306 over the optical spacer 2304. The LED panel 2302 includes a driver circuit wafer 2308, a bonding metal layer 2310 formed over the driver circuit wafer 2308, and an LED array 2312 formed over the bonding metal layer 2310. The driver circuit wafer 2308 includes a plurality of driver circuits 2308-4. The driver circuit wafer 2308 and the driver circuits 2308-4 are similar to the driver circuit wafer 1608 and the driver circuits 1608-4 described above with reference to FIG. 16, and thus their detailed description is omitted here.

The LED array 2312 includes a plurality of flip-chip LED dies 2312-2. The bonding metal layer 2310 includes first bonding metal pads 2310-2 and second bonding metal pads 2310-4. Each of the first bonding metal pads 2310-2 is electrically coupled to one electrode, such as the p-electrode, of the corresponding LED die 2312-2, and is also electrically coupled to the corresponding driver circuit 2308-4. Similarly, each of the second bonding metal pads 2310-4 is electrically coupled to another electrode, such as the n-electrode, of the corresponding LED die 2312-2, and is coupled to a common ground 2318.

As shown in FIG. 23, the optical spacer 2304 includes a plurality of spacer units 2304-2 separated and electrically isolated from each other. Each of the spacer units 2304-2 corresponds to one of the LED dies 2312-2. Since the LED dies 2312-2 and the optical spacer 2304 are formed of the same semiconductor growth substrate, electrically isolating the spacer units 2304-2 ensures electrical isolation between the LED dies 2312-2.

Further, the micro lens array 2306 includes a plurality of micro lenses 2306-2. The micro lenses 2306-2 are similar to the micro lenses 1606-2 in terms of size, shape, and configuration, but are made from the same semiconductor epitaxial layer as the optical spacer units 2304-2 and the LED dies 2312-2. As shown in FIG. 23, the micro lenses 2306-2 are also separated and electrically isolated from each other.

Specifically, to form the LED display panel 2300 having the micro lenses 2306-2, an exemplary process described below can be used. First, a semiconductor epitaxial layer is grown on a semiconductor growth substrate. The semiconductor epitaxial layer can include a plurality of epitaxial sub-layers according to the LED array 2312 to be formed. The semiconductor epitaxial layer is then processed to form the LED array 2312, resulting in a semiconductor epitaxial wafer having the plurality of LED dies 2312-2 formed on one side of the semiconductor epitaxial layer, which in turn is formed on the semiconductor growth substrate. The semiconductor epitaxial wafer is then aligned and bonded onto the driver circuit wafer 2308 such that each of the LED dies 2312-2 is bonded to one of the driver circuits 2308-4 of the driver circuit wafer 2308. After bonding, the semiconductor growth substrate is removed, leaving the semiconductor epitaxial layer bonded to the driver circuit wafer 2308. The semiconductor growth substrate can be removed by, for example, a laser lift-off process or an etching process, such as a wet etching process or a dry etching process. The back side of the semiconductor epitaxial layer, i.e., the side opposite to the side on which the LED dies 2312-2 are formed, is processed using, for example, one of the above-described processes for forming micro lenses. In some embodiments, the semiconductor epitaxial layer is processed such that the micro lenses 2306-2 are separated and electrically isolated from each other. Further, a portion of the semiconductor epitaxial layer between the micro lens array 2306 and the LED array 2312 is processed to form the spacer units 2304-2 that are separated and electrically isolated from each other by, for example, an etching process. In some embodiments, before the process for forming the micro lenses 2306-2 is conducted, the semiconductor epitaxial layer is thinned from the back side, for example, by a polishing process or an etching process.

In the exemplary LED display panel described above, one pixel of the LED display panel includes one LED die, i.e., each driver circuit controls one LED die. In some embodiments, the LED display panel can have pixels each including two or more LED dies, in which each driver circuit controls two or more LED dies.

Figure 24A:
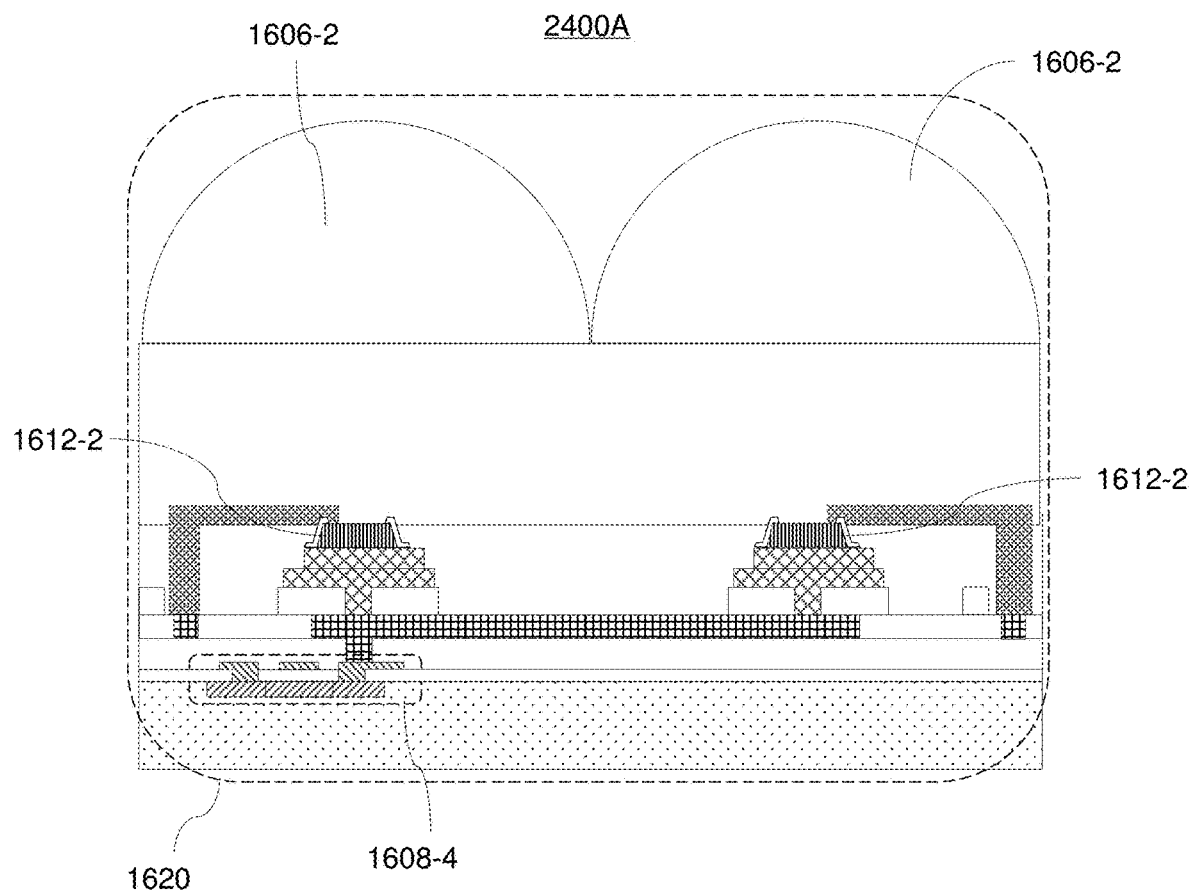
FIGS. 24A and 24B schematically show LED display panels according to other exemplary embodiments.

FIG. 24A is a cross-sectional view of another exemplary LED display panel 2400A consistent with the present disclosure. The LED display panel 2400A is similar to the LED display panel 1600, except that in the LED display panel 2400A, each pixel 1620 includes two LED dies 1612-2 (only one pixel is shown in FIG. 24A). The two LED dies 1612-2 in the same pixel 1620 are coupled in parallel to each other and are coupled to the same driver circuit 1608-4. In the LED display panel 2400A, the two LED dies 1612-2 in the same pixel 1620 correspond to different micro lenses 1606-2.

Figure 24B:
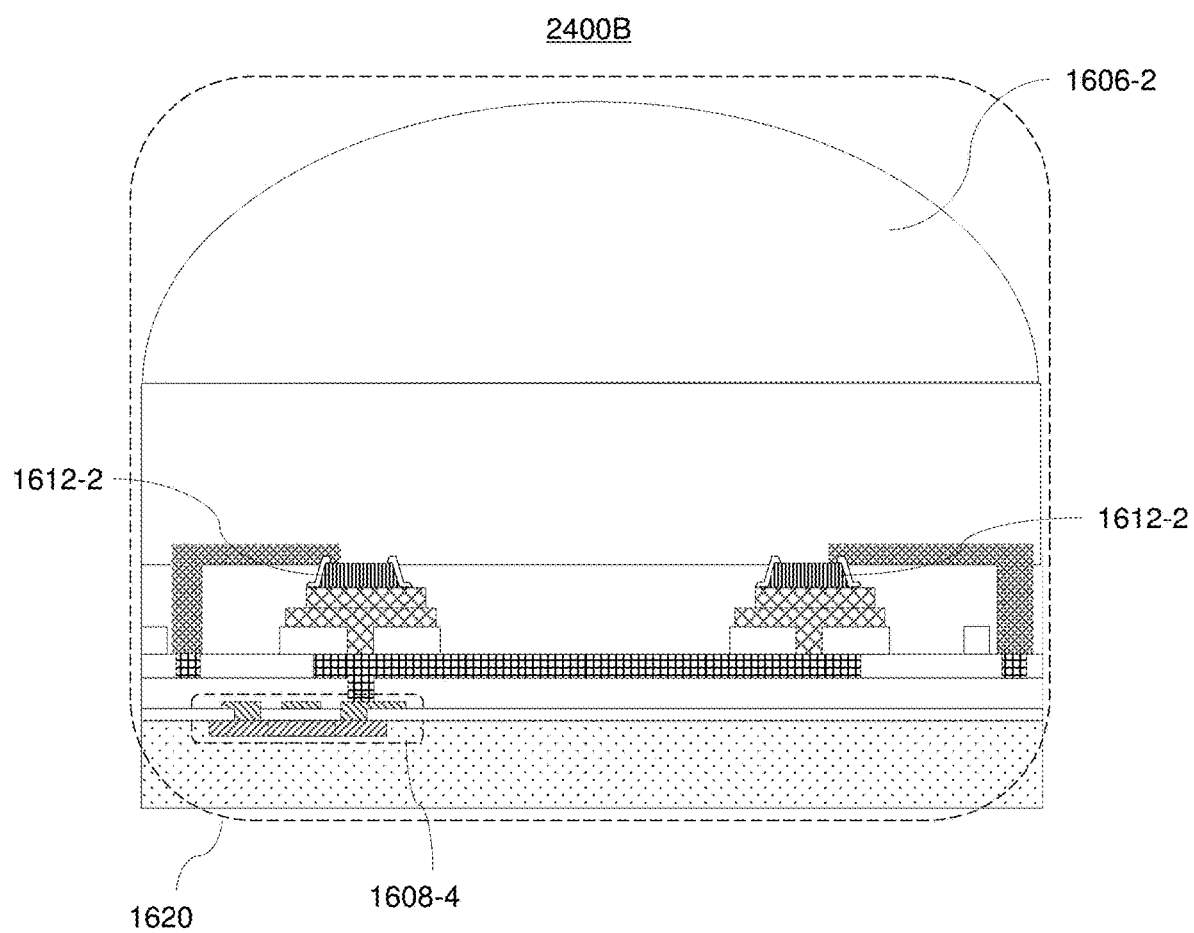

FIG. 24B is a cross-sectional view of another exemplary LED display panel 2400B consistent with the present disclosure. The LED display panel 2400B is similar to the LED display panel 2400A, except that in the LED display panel 2400B, the two LED dies 1612-2 in the same pixel 1620 share the same micro lens 1606-2. Although FIG. 24B shows two LED dies 1612-2 sharing the same micro lens 1606-2, the disclosed device can also be practiced with more than two LED dies sharing the same micro lens. That is, according to the present disclosure, each micro lens can correspond to and be arranged over two or more LED dies.

In some embodiments, for example, as shown in FIGS. 16, 21, 22A, 22B, 23, and 24A, each micro lens is aligned with one corresponding LED die, e.g., the center of the micro lens is approximately aligned with the center of the corresponding LED die. In some embodiments, for example, as shown in FIG. 24B, the micro lens does not align with individual LED dies.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A light-emitting diode (LED) display panel, comprising:
   an LED panel including:
      a driver circuit wafer including a substrate and a driver circuit formed in the substrate; and
      an LED array including a plurality of LED dies coupled to the driver circuit;
   a micro lens array arranged over the LED panel;
   an optical spacer formed between the LED panel and the micro lens array; and
   a mechanical fixture holding the driver circuit wafer and the micro lens array,
   wherein the optical spacer includes an air gap.

2. The LED display panel of claim 1, wherein the micro lens array includes a plurality of micro lenses, and
   each of the micro lenses is aligned with the corresponding one of the LED dies.

3. The LED display panel of claim 1, wherein the micro lens array is made of one of a polymer material, a dielectric material, or a semiconductor material.

4. The LED display panel of claim 1, wherein the micro lenses are arranged in a triangular matrix, a square matrix, a rectangular matrix, or a hexagonal matrix.

5. The LED display panel of claim 1, wherein each of the micro lenses has a lateral size larger than a lateral size of the corresponding at least one of the LED dies.

6. The LED display panel of claim 1, wherein each of the micro lenses includes one of a spherical lens, an aspherical lens, or a Fresnel lens.

7. The LED display panel of claim 1, wherein the driver circuit includes a plurality of pixel driver circuits, and
   each pixel driver circuit is coupled to two or more of the LED dies.

8. The LED display panel of claim 1, wherein the micro lens array includes a plurality of micro lenses, and
   each of the micro lenses corresponds to and is arranged over two or more of the LED dies.

9. The LED display panel of claim 1, wherein:
   the micro lens array includes a protrusion portion of a micro lens assembly, and
   the protrusion portion faces the LED array.

10. The LED display panel of claim 1, wherein:
    the micro lens array includes a protrusion portion of a micro lens assembly,
    the micro lens assembly further includes a base portion supporting the protrusion portion,
    the protrusion portion faces opposite to the LED array, and
    the optical spacer further includes the base portion.

11. A light-emitting diode (LED) display panel, comprising:
    a substrate;
    a driver circuit array formed in the substrate;
    an LED array including a plurality of LED dies coupled to the driver circuit array;
    a micro lens array arranged over at least one of the LED dies; and
    an optical spacer formed between the LED array and the micro lens array,
    wherein the LED array, the optical spacer, and the micro lens array are made from a same semiconductor epitaxial layer grown on a semiconductor growth substrate.

12. The LED display panel of claim 11, wherein the micro lens array includes a plurality of micro lenses, and
    each of the micro lenses is aligned with the corresponding one of the LED dies.

13. The LED display panel of claim 12, wherein the micro lenses are arranged in a triangular matrix, a square matrix, a rectangular matrix, or a hexagonal matrix.

14. The LED display panel of claim 12, wherein each of the micro lenses has a lateral size larger than a lateral size of the corresponding at least one of the LED dies.

15. The LED display panel of claim 12, wherein each of the micro lenses includes one of a spherical lens, an aspherical lens, or a Fresnel lens.

16. The LED display panel of claim 12, wherein a bottom of each of the micro lenses has one of a circular shape, a square shape, a rectangular shape, a triangle shape, or a hexagonal shape.

17. The LED display panel of claim 11, wherein the driver circuit array includes a plurality of pixel driver circuits, and
    each pixel driver circuit is coupled to two or more of the LED dies.

18. The LED display panel of claim 17, wherein the two or more LED dies coupled to the same pixel driver circuit are coupled to each other in parallel.

19. The LED display panel of claim 11, wherein the micro lens array includes a plurality of micro lenses, and
    each of the micro lenses corresponds to and is arranged over two or more of the LED dies.

20. The LED display panel of claim 11, wherein:
    the optical spacer includes a plurality of spacer units separated and electrically isolated from each other, and
    each of the spacer units corresponds to and is formed over one of the LED dies.

* * * * *